US012301260B1

(12) United States Patent
Ji et al.

(10) Patent No.: US 12,301,260 B1
(45) Date of Patent: May 13, 2025

(54) SYSTEMS AND METHODS FOR GENERATING OPTIMIZED COMBINATION SETS FOR ERROR CORRECTION IN DATA TRANSMISSION

(71) Applicant: SK Hynix NAND Product Solutions Corp., Rancho Cordova, CA (US)

(72) Inventors: Young Hoon Ji, Vancouver (CA); Nathan Poon, Vancouver (CA)

(73) Assignee: SK Hynix NAND Product Solutions Corp., Rancho Cordova, CA (US)

( * ) Notice: Subject to any disclaimer, the term of this patent is extended or adjusted under 35 U.S.C. 154(b) by 58 days.

(21) Appl. No.: 18/507,765

(22) Filed: Nov. 13, 2023

(51) Int. Cl.
  *H03M 13/00* (2006.01)
  *H04L 1/00* (2006.01)
(52) U.S. Cl.
  CPC ....... *H03M 13/616* (2013.01); *H03M 13/611* (2013.01); *H04L 1/0041* (2013.01); *H04L 1/0061* (2013.01)
(58) Field of Classification Search
  CPC ... H04L 1/0041; H04L 1/0045; H04L 1/0061; H03M 13/616; H03M 13/611
  See application file for complete search history.

(56) References Cited

U.S. PATENT DOCUMENTS

2010/0058140 A1* 3/2010 Matsumoto ....... H03M 13/6508
  714/752
2020/0089732 A1 3/2020 Batruni
2021/0357476 A1 11/2021 Lee et al.
2023/0353169 A1 11/2023 Tullberg et al.
2023/0393937 A1* 12/2023 Oboukhov .......... G06F 11/1068

FOREIGN PATENT DOCUMENTS

CN      115642918 A     1/2023
WO      2023/174027 A1  9/2023

* cited by examiner

*Primary Examiner* — Shelly A Chase
(74) *Attorney, Agent, or Firm* — HALEY GUILIANO LLP

(57) ABSTRACT

A non-transitory computer-readable medium, method and system, the system including processing circuitry. The processing circuitry is to generate a first matrix, perform an incident cycle optimization process using the first matrix to generate a modified first matrix, and perform an encoder gate optimization process using the modified first matrix to generate a further modified first matrix. Processing circuitry is then to generate a second matrix including the further modified first matrix as a submatrix of the second matrix, perform the incident cycle optimization process using the second matrix to generate a modified second matrix, and perform the encoder gate optimization process using the further modified first matrix and the modified second matrix to generate a further modified second matrix. Processing circuitry then configures a transmitting device that receives and encodes transmission data the using the further modified first matrix and further modified second matrix, and transmits the encoded transmission data.

32 Claims, 11 Drawing Sheets

SYSTEMS AND METHODS FOR GENERATING OPTIMIZED COMBINATION SETS FOR ERROR CORRECTION IN DATA TRANSMISSION

TECHNICAL FIELD

The present disclosure is directed to systems and methods for encoding data with error correction codes constructed using an iteratively-generated combination set of optimized matrices.

SUMMARY

In accordance with the present disclosure, systems, non-transitory computer-readable medium and methods are provided for enabling a transmitting device to perform data encoding with error correction codes based on an iteratively generated set of matrices optimized for incident cycles and the number of encoder gates needed to encode data. The system, non-transitory computer-readable medium, and methods disclosed herein enable the generating and optimizing of matrices (that represent an error correction code) to configure a transmitting device (e.g., a Solid State Drive (SSD) storage device or a network transmission device) to receive transmission data, encode transmission data with an error correction code based on one of the optimized matrices (selected based on sizing of the data to be transmitted), and transmit the encoded transmission data on a channel. The transmitting device is configured to encode transmission data with error correction code based on one of the optimized matrices of the combination set, the transmitting device selects the optimized matrix based on the size of the data to be transmitted, the size of the channel, or the amount of available memory.

In some approaches, a transmitting device (e.g., an SSD device) is configured with a set of random matrices or a set of matrices, each of which has been independently optimized. Issues that may arise from configuring the transmitting device with a random set of matrices include some number of incident cycles within the set of random matrices, which cause an increase in error correction code failures of the encoded transmission data, and an excess in encoder gates needed to encode data using each of the randomly-generated matrix. The excess of encoder gates is also an issue in the approach of using a set of independently-optimized matrices as each matrix does not necessarily have any overlapping entries in respective locations and values within each matrix.

The optimized matrices may be used to construct the error correction code used to encode transmission data with any suitable form of error correction codes (e.g., low-density parity check (LDPC) codes). Each respective generated matrix is optimized using an incident cycle optimization process to reduce a number of incident cycles within the respective generated matrix, and an encoder gate optimization process to reduce the number of encoder gates needed to encode transmission data with the respective matrix. The incident cycle optimization process is used to improve the error floor of constructing error correction codes by reducing the number of incident cycles of at most a predetermined length which may cause error correction code failures. The encoder gate optimization process reduces the amount of hardware needed to encode transmission data for a given matrix. In addition, reducing the encoder gate count reduces the amount of silicon area of the transmitting device and power consumption of the transmitting device. This also enables the transmitting device (e.g., an SSD device) to provide more power to perform read and write operations at greater throughputs.

A matrix that contains many incident cycles may cause an unexpected increase in the rate of error correction code failures, even when transmitting on a bus or channel with little noise, and therefore raise the error floor of the constructed error correction codes. In order to reduce the error floor of bit errors during error correction code construction by the transmitting device, incident cycles of at most a predetermined length should be avoided or removed from matrices by matrix manipulation. In some embodiments, the predetermined length corresponds to a length of incident cycles that cause a greater rate of error correction code failures than lengths that are longer than the predetermined length. In some embodiments, the encoder gate optimization process may reduce the number of encoder gates needed to encode transmission data with a respective matrix by performing matrix manipulation.

In some embodiments, a system is provided with a set of fixed processing circuitry that matches a constructed set of matrices. In such embodiments, the system selects which matrix to use for determining error correction codes based on the size of the channel and transmission data. The processing circuitry may be implemented as a system on a chip (SoC), an field programmable gate array (FPGA), or updatable firmware. In some embodiments, a system is provided with a matrix-generating device that includes memory and processing circuitry that are communicatively coupled to each other. In some embodiments, the matrix-generating device is the same transmitting device that is configured by the generated and optimized matrices to receive data, encode data and transmit the encoded data. In some embodiments, the processing circuitry of the matrix-generating device generates a first matrix and performs an incident cycle optimization process using the first matrix to generate a modified first matrix with fewer incident cycles than the first matrix. The processing circuitry then performs an encoder gate optimization process to generate a further modified first matrix with fewer encoder gates needed to encoder data using the further modified first matrix than when using the modified first matrix. In some embodiments, the processing circuitry generates a second matrix which includes the further modified first matrix as a submatrix of the second matrix. The processing circuitry then performs the incident cycle optimization process using the second matrix to generate a modified second matrix with fewer incident cycles than the second matrix and performs the encoder gate optimization process using each of the further modified first matrix and modified second matrix to generate a further modified second matrix that requires fewer encoder gates to encode data than that of the modified second matrix. Then processing circuitry configures a transmitting device (e.g., an SSD device) which is communicatively coupled to the matrix-generating device using the further modified first matrix and the further modified second matrix. In some embodiments, the transmitting device may itself generate and optimize the further modified first matrix and further modified second matrix. The transmitting device may be any suitable device that is configured by processing circuitry to receive transmission data (e.g., data from SSD memory or from an external host), encode the transmission data with one of the further modified first matrix and the further modified second matrix, and transmit the encoded transmission data over a channel. For example, the channel may be a bus interface or network cable that communicatively couples the transmitting device to an external receiving device, which decodes the encoded transmission data. In some embodiments, the error correction codes (e.g., LDPC codes) used to encode transmission data are used to detect channel reliability issues.

In one approach, the matrix-generating device generates and optimizes each matrix of a combination set of matrices at a suitable time before configuring the transmitting device. (e.g., an SSD device). This improves the memory use efficiency of each configurable transmitting device and ensures that only one matrix-generating device is needed for dedicated matrix generation and optimization. In some embodiments, multiple transmitting devices (e.g., SSD devices) may receive the constructed set of matrices and determine error correction codes based on one optimized matrix of the constructed set of matrices to encode transmission data of various sizes. This enables the system to distribute the constructed set of matrices among the multiple transmitting devices, each of which may be re-configured by another set of matrices generated and optimized by the matrix-generating device. In some embodiments, the processing circuitry of the transmitting device is configured based on the constructed set of matrices (e.g., such as in an SSD controller device) and selects error correction codes based on one of the constructed set of matrices to encode transmission data of various sizes.

BRIEF DESCRIPTION OF THE DRAWINGS

The following description includes discussion of figures having illustrations given by way of examples of implementations of embodiments of the disclosure. The drawings should be understood by way of example, and not by way of limitation. As used herein, references to one or more "embodiments" are to be understood as describing a particular feature, structure, and/or characteristic included in at least one implementation. Thus, phrases such as "in one embodiment" or "in an alternate embodiment" appearing herein describe various embodiments and implementations and do not necessarily all refer to the same embodiment. However, they are also not necessarily mutually exclusive.

DETAILED DESCRIPTION

Figure 1:
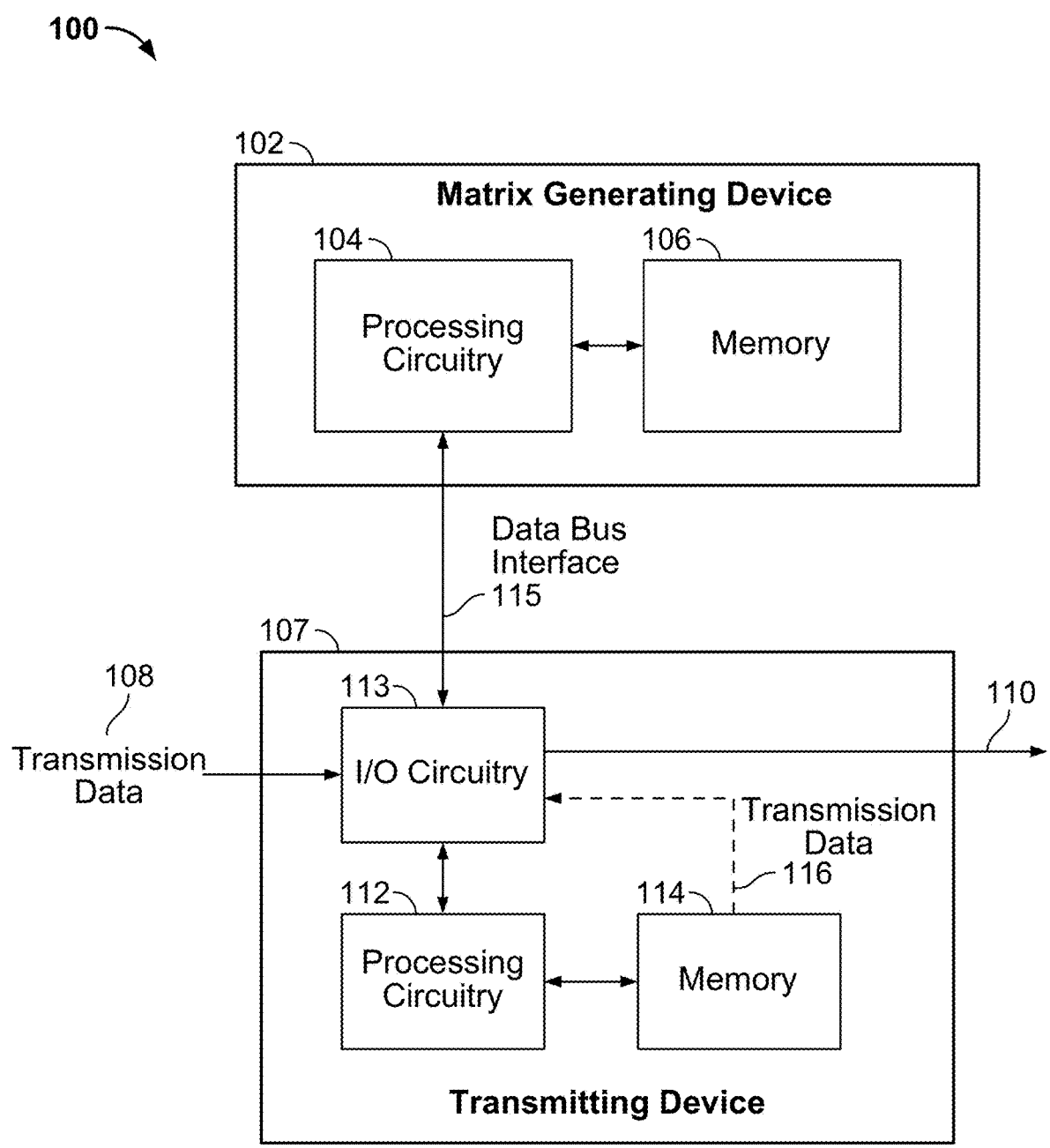
FIG. 1 shows an illustrative diagram of a system of a transmitting device that is communicatively coupled to a matrix-generating device with processing circuitry and memory, in accordance with some embodiments of the present disclosure.

In accordance with the present disclosure, systems, non-transitory computer-readable medium and methods are provided for iteratively constructing a set of error correction codes in at least one transmitting device, each transmitting device configured by a matrix-generating device. Error correction codes (e.g., low-density parity-check (LDPC) codes) are data signal schemata that append redundant data to transmission data to be transmitted over a channel. The system of the present disclosure includes at least one transmitting device and a matrix-generating device to generate and optimize matrices which are used to configure at least one transmitting device to receive transmission data, encode the transmission data with one of the optimized matrices, and transmit the encoded transmission data over a channel. A respective transmitting device transmits the encoded transmission data to a receiving device that uses the redundant data (e.g., the error correction code) to ensure the consistency of the originally transmitted transmission data, and to recover or correct data that has been corrupted during transmission over the channel. In some embodiments, the redundant data (e.g., error correction code) includes parity or check bits generated by a respective transmitting device using an error correction code engine constructed using optimized matrices generated by the matrix-generating device. A transmitting device (e.g., a storage device such as an SSD) may use error correction codes to detect any irregularities that a signal may incur after transmitting over a network bus or channel. In some embodiments, the transmitting device may be any suitable device that transmits signals and may use error correction codes for improved reliability of the network bus, or the channel used by the transmitting device.

Error correction codes may be constructed by an error correction code engine of the transmitting device configured by the optimized matrices from the matrix-generating device. In some embodiments, the optimized matrices are formed by the matrix-generating device by performing an incident cycle optimization process to reduce the number of incident cycles of at most a predetermined length within the generated matrices, and performing an encoder gate optimization process to reduce the number of encoder gates needed to encode transmission data using the optimized matrices. The generated matrices of the matrix-generating device may be optimized by the processing circuitry of the matrix-generating device to remove irregularities such as incident cycles and the total number of encoder gates needed to encode data that correspond to a respective matrix.

During the incident cycle optimization process, matrices may be evaluated for incident cycles by using the Fossorier Condition. In some embodiments, a Fossorier Condition may be used to evaluate incident cycles of a certain length (e.g., 4-cycle, 8-cycle, 12-cycle, etc.) for each instantiation of a respective matrix. An incident cycle may be represented by a sequence of nodes connected by edges in a Tanner graph corresponding to a respective matrix. A Tanner graph corresponding to a matrix instantiation includes nodes that are used to represent state constraints or equations for error correction codes. An edge may be defined as a connection between two nodes of the Tanner graph. The length of a respective incident cycle may be defined as the number of nodes in the sequence of nodes of the respective incident cycle. An incident cycle may be defined as a sequence of nodes, each respective node of the sequence of nodes connected to a respective subsequent node by a respective edge, wherein the sequence of nodes may be traversed along the edges of the sequence of nodes from a first node of the sequence to a last node of the sequence without repeating any of the previously traversed edges. As discussed herein, processing circuitry generates a respective modified matrix from a respective matrix using the incident cycle optimization process.

During the encoder gate optimization process processing circuitry uses a respective modified matrix to generate a respective further modified first matrix, wherein fewer encoder gates are needed to encode data using the respective further modified matrix than when using the respective modified matrix. In some embodiments, processing circuitry causes at least one swap between a first row and a second row for the respective modified matrix to generate the respective further modified matrix. In some embodiments, when generating the respective further modified matrix processing circuitry also causes at least one swap between a first column and a second column for the respective modified matrix. In some embodiments, the respective further modified matrix includes a data submatrix and a parity check submatrix. To generate the respective further modified matrix, processing circuitry may generate a respective inverse matrix of the parity check submatrix of the respective further modified matrix. In some embodiments, processing circuitry evaluates the inverse matrix of the parity check submatrix for a number of encoder gates needed to encode data using the respective further modified second matrix. In some embodiments, processing circuitry evaluates the inverse matrix for a number of encoder gates needed to encode data using the corresponding matrix based on a number of non-zero values in the inverse matrix.

For purposes of brevity and clarity, the features of the disclosure described herein are in the context of a system with a matrix-generating device having processing circuitry to configure a transmitting device (e.g., an SSD). However, the principles of the present disclosure may be applied to any other suitable context in which error correction code construction is performed on the transmitting device. In addition, the matrix-generating device may include processing circuitry and memory, where the processing circuitry and memory are communicatively coupled by a network bus or interface. In some embodiments, the processing circuitry generates and optimizes multiple matrices as a combination set of matrices and stores the combination set of matrices in the memory.

In some embodiments, a processor of the processing circuitry may be a highly parallelized processor capable of handling high bandwidths of data quickly (e.g., concurrently generating and optimizing multiple combination sets of matrices).

In some embodiments, the system and methods of the present disclosure may refer to a transmitting device, which may be a storage device such as an SSD.

An SSD is a data storage device that uses integrated circuit assemblies as memory to store data persistently. SSDs have no moving mechanical components, and this feature distinguishes SSDs from traditional electromechanical magnetic disks, such as, hard disk drives (HDDs) or floppy disks, which contain spinning disks and movable read/write heads. Compared to electromechanical disks, SSDs are typically more resistant to physical shock, run silently, have lower access time, and less latency.

Many types of SSDs use NAND-based flash memory which retain data without power and include a type of non-volatile storage technology. Quality of Service (QoS) of an SSD may be related to the predictability of low latency and consistency of high input/output operations per second (IOPS) while servicing read/write input/output (I/O) workloads. This means that the latency or the I/O command completion time needs to be within a specified range without having unexpected outliers. Throughput or I/O rate may also need to be tightly regulated without causing sudden drops in performance level.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, firmware, software, or any combination thereof. The material disclosed herein may also be implemented as instructions stored on a machine-readable medium, which may be read and executed by one or more processors. A machine-readable medium may include any medium and/or mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals (e.g., carrier waves, infrared signals, digital signals, etc.), and others.

The subject matter of this disclosure may be better understood by reference to FIGS. 1-13.

FIG. 1 shows an illustrative diagram of a system 100 of a transmitting device 107 (e.g., SSD device or network transmission device) communicatively coupled to a matrix-generating device 102 with processing circuitry 104 and memory 106, in accordance with some embodiments of the present disclosure. In some embodiments, transmitting device 107 may be a server device or a solid-state storage device (e.g., an SSD device). In some embodiments, matrix-generating device 102 may be a controller (e.g., a memory controller). In some embodiments, matrix-generating device 102 and transmitting device 107 are communicatively coupled via a data bus interface 115, network channel, or wireless connection. Processing circuitry 104 may include a processor or any suitable processing unit and in some embodiments, memory 106 may be non-volatile memory. It will be understood that the embodiments of system 100 of the present disclosure are not limited to server devices or SSD devices. For example, in some embodiments, transmitting device 107 may include a hard disk drive (HDD) device in addition to or in place of an SSD.

Transmitting device 107 may be a storage device (e.g., an SSD device), which may include one or more packages of memory dies in device memory, where each die includes storage cells. In some embodiments, the storage cells are organized into pages, and pages are organized into blocks. Each storage cell can store one or more bits of information. Transmitting device 107 is configured to receive transmission data 108 and encode transmission data 108. In some embodiments, transmission data is transmission data 108 from an external source. In some embodiments, the transmission data to be encoded by processing circuitry 112 is from an internal source (e.g., transmission data from memory 114). For example, transmission data 116 is sent to I/O circuitry 113 from a set of SSD NAND memory cells of memory 114. In some embodiments, transmitting device 107 may be any suitable device (e.g., a storage device), which transmits encoded transmission data over a channel 110 (e.g., communication channel, bus, or interface) to improve the reliability of signal communications from transmitting device 107. In some embodiments, transmitting device 107 includes processing circuitry 112 and memory 114. In some embodiments, memory 114 stores suitable firmware for transmitting device 107. In addition, memory 114 is configured to store matrices used for error correction codes. The processing circuitry 112 of transmitting device 107 is to be configured by the optimized matrices of a combination set of matrices generated by matrix-generating device 102. In some embodiments, transmitting device 107 includes an input/output (I/O) circuitry 113 to receive transmission data 108 and transmit encoded transmission data 110. In some embodiments, I/O circuitry 113 receives a signal from processing circuitry 104 of matrix-generating device 102 to configure the transmitting device 107. When transmitting data over a channel (e.g., channel 110) the data may become lost or corrupted during transmission over the channel 110. In some embodiments, channel 110 is a data interface or network configured to transport encoded transmission data. If the data is encoded with error correction codes (e.g., low-density parity-check (LDPC) codes) before transmission over the channel, the encoded error correction code may be used to detect or recover a portion of the data that is lost or corrupted.

In some embodiments, matrix-generating device 102 may be any suitable controller to generate and optimize matrices to construct a set of error correction codes. According to techniques, e.g., in FIG. 2 below, matrix-generating device 102 generates and optimizes a combination set of matrices that includes at least two optimized matrices. Matrix generating device 102 uses each matrix of the combination set of matrices to configure transmitting device 107. In some embodiments, transmitting device 107 is configured to encode received transmission data 108 using one of the matrices of the combination set of matrices and then transmit the encoded transmission data over channel 110. In some embodiments, processing circuitry 112 of transmitting device 107 may be configured to generate and optimize each matrix of a combination set of matrices as disclosed herein.

In some embodiments, the processing circuitry 104 is communicatively coupled to memory 106. Processing circuitry 104 is configured to access and store data in memory 106. The data stored in memory 106 may be any intermediate matrix data or optimized matrix data used when processing circuitry 104 generates and optimizes the combination set of matrices. In some embodiments, processing circuitry 104 may read matrix data from memory 106 or write matrix data to memory 106. There may also be a temporary memory (e.g., a cache or queue) disposed within the processing circuitry 104, the temporary memory configured to store any outstanding data that is to be processed by the processing circuitry 104 when generating and optimizing each respective matrix of the combination set of matrices. In some embodiments, the combination set of matrices includes at least two matrixes, each of which has been optimized for incident cycles within each respective matrix and for the number of encoder gates needed to encode transmission data with each respective matrix.

In some embodiments, a data bus is used to transport data associated with the iterative error correction code construction. The data bus between the memory 106 and processing circuitry 104 provides a network bus for accessing or writing data to memory 106. In some embodiments, the processor or processing unit of processing circuitry 104 may include a hardware processor, a software processor (e.g., a processor emulated using a virtual machine), or any combination thereof. The processor, also referred to herein as processing circuitry 104, may include any suitable software, hardware, or both for controlling the memory 106, the processing circuitry 104, and communicating with transmitting device 107. In some embodiments, matrix-generating device 102 may further include a multi-core processor. Memory 106 may also include hardware elements for non-transitory storage of instructions, commands, or requests that when executed cause the method shown in FIG. 2 to be performed in non-transitory memory.

In some embodiments, transmitting device 107 may include device memory that includes any one or more of non-volatile memory, such as Phase Change Memory (PCM), a PCM and switch (PCMS), a Ferroelectric Random Access Memory (FeRAM), or a Ferroelectric Transistor Random Access Memory (FeTRAM), a Memristor, a Spin-Transfer Torque Random Access Memory (STT-RAM), and a Magnetoresistive Random Access Memory (MRAM), any other suitable memory, or any combination thereof. In some embodiments, device memory may also include spinning magnetic hard disk drives (HDDs). In some embodiments, device memory may also include any one or more volatile memory, such as dynamic random access memory (DRAM) and static random access memory (SRAM).

Once the combination set of matrices is optimized by processing circuitry 104 for incident cycles and encoder gates needed to encode transmission data 108 using each matrix of the combination set, each matrix of the combination set may be used to encode transmission data 108 with fewer encoder gates, which reduces silicon area cost and power consumption of transmitting device 107. In some embodiments, reduced power consumption results in a transmitting device 107 that may allocate more power to perform instructions (e.g., reads and writes) at higher throughputs. By optimizing each matrix for incident cycles, processing circuitry 104 reduces the likelihood of errors in the construction of error correction code, which reduces the overall error floor for error correction code construction. Once the combination set of matrices has been generated and optimized, processing circuitry 104 configures transmitting device 107 with each matrix of the combination set of matrices. Transmitting device 107 is configured to receive transmission data 108, encode the transmission data 108 using one of the matrices of the combination set, and transmit encoded transmission data over channel 110. In some embodiments, matrix-generating device 102 may be communicatively coupled, via data bus interface 115, to more than one device (e.g., transmitting device 107) to configure multiple devices using the combination set of matrices. In some embodiments, the matrix-generating device 102 may generate and optimize more than one combination set of matrices, such that each respective combination set of matrices is used to configure a respective device (e.g., transmitting device 107) among multiple devices.

In some embodiments, the matrix-generating device 102 generates and optimizes each matrix of the combination set of matrices at any time prior to communicatively coupling to the transmitting device 107 via the data bus interface 115. Therefore, the combination set of matrices may be generated and optimized by the processing circuitry 104 of matrix-generating device 102 and store the combination set of matrices in memory 106. Once the matrix-generating device 102 is communicatively coupled to transmitting device 107, the matrix-generating device 102 may configure the transmitting device 107 using each optimized matrix of the combination set of matrices at any time after communicatively coupling the matrix-generating device 102 to the transmitting device 107.

For example, the combination set of matrices includes a further modified first matrix, a further modified second matrix, and a further modified second matrix, such that the further modified first matrix is a submatrix of the further modified second matrix, which is a submatrix of the further modified third matrix. When transmitting device 107 receives transmission data 108, transmitting device 107 encodes the transmission data 108 using one of the matrices of the combination set (e.g., further modified first matrix, further modified second matrix, or further modified third matrix). In some embodiments, transmitting device 107 selects one matrix of the combination set of matrices with which to encode the transmission data 108 based on at least one of a size of the transmission data, the size of the channel, and a size of available memory. Lastly, transmitting device 107 transmits the encoded transmission data over channel 110.

It will be understood that, while system 100 depicts an embodiment in which matrix-generating device 102 configures transmitting device 107 that has capabilities for transmitting encoded transmission data 108 using a combination set of matrices optimized for incident cycles and encoder gates needed to encode transmission data 108 in accordance with the present disclosure, any other suitable matrix-generating device and device may be implemented in a similar manner.

For purposes of clarity and brevity, and not by way of limitation, the present disclosure is provided in the context of error correction code construction using iteratively generated optimized matrices with which to configure a transmitting device that encodes transmission data and transmits the encoded transmission data over a channel. The process of constructing error correction code using iteratively generated optimized matrices may be configured by any suitable software, hardware (e.g., system on a chip (SOC), or field-programmable gate array (FPGA)), or both for implementing such features and functionalities. The iterative generation of optimized matrices for the construction of error correction code may be at least partially implemented in, for example, matrix-generating device 102 (e.g., as part of processing circuitry 104, or any other suitable device). The encoding of transmission data 108 using constructed error correction code, and transmission of error correction encoded transmission data may be at least partially implemented in, for example, transmitting device 107 (e.g., as part of a processing unit, or any other suitable device). For example, for a storage device (i.e., transmitting device 107), the encoding of transmission data 108 and transmission of error correction encoded data may be implemented in processing circuitry 112 (e.g., a processing unit) of the storage device.

Figure 2:
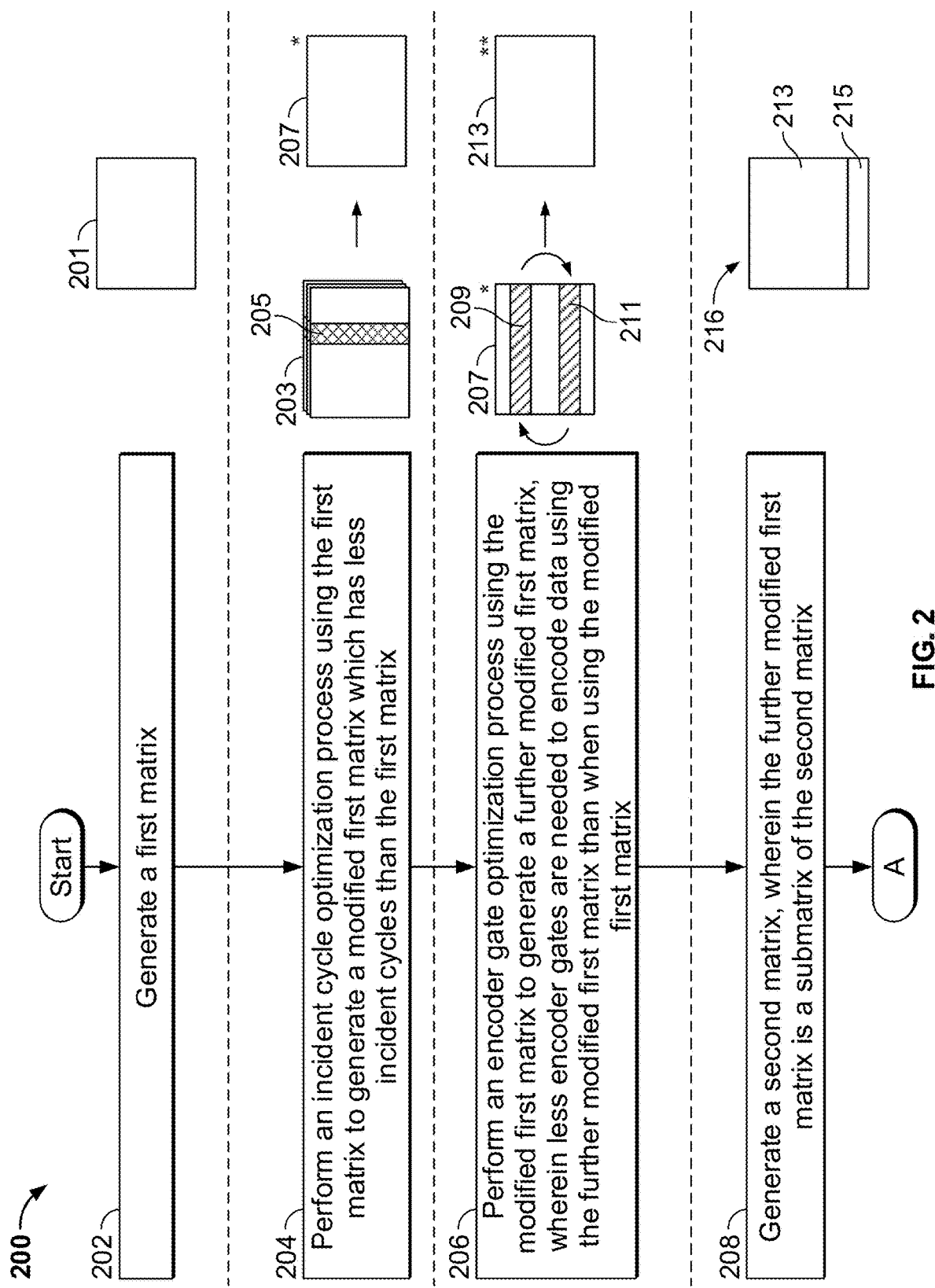
FIGS. 2 and 3 show flowcharts of illustrative steps for constructing a set of error correction codes, in accordance with some embodiments of the present disclosure.
Figure 2:
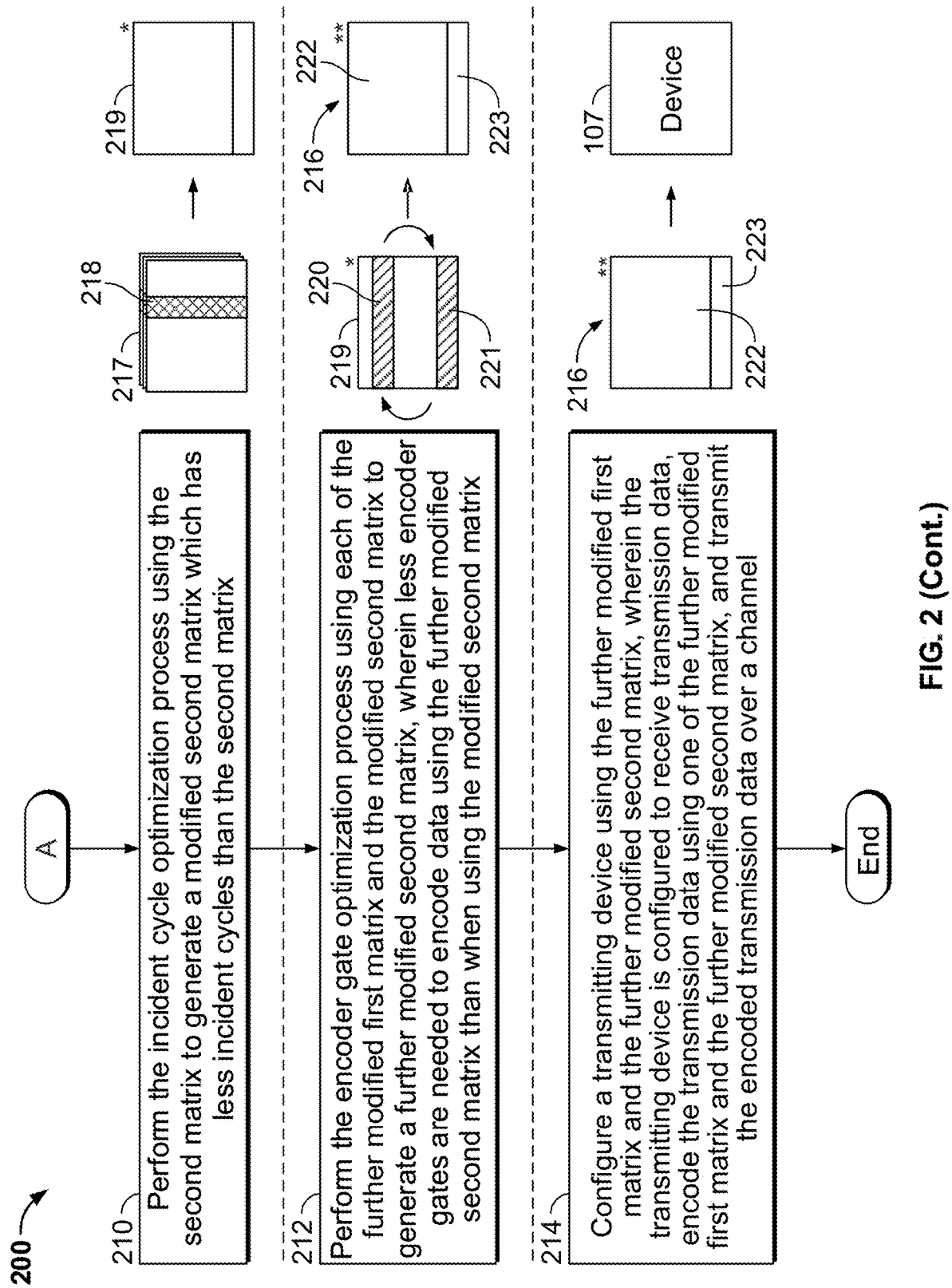

FIG. 2 shows a flowchart of illustrative steps of process 200 for constructing a set of error correction codes, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, memory 106 stores instructions that when executed by processing circuitry 104 cause steps 202-214 to be performed. In some embodiments, process 200 can be modified by, for example, having respective steps rearranged, changed, added, and/or removed.

At step 202, processing circuitry (e.g., processing circuitry 104) generates a first matrix 201. In some embodiments, processing circuitry generates the first matrix 201 based on one of a random matrix and a previously generated matrix stored in memory. In some embodiments, the random matrix is generated using a random number generator implemented on the processing circuitry. In some embodiments, the first matrix 201 is of a first size, including a number of rows and a number of columns.

At step 204, processing circuitry performs an incident cycle optimization process using the first matrix 201 to generate a modified first matrix 207 that has fewer incident cycles than the first matrix. In some embodiments, processing circuitry generates a plurality of matrix instantiations 203 based on the first matrix 201. In some embodiments, processing circuitry generates the plurality of matrix instantiations 203 using a plurality of additive matrices 205. In some embodiments, each additive matrix of the plurality of additive matrices 205 is of a number of rows that is the same as the number of rows of the first matrix 201. In some embodiments, the number of columns in each additive matrix 205 is smaller than the number of columns of the first matrix 201. Each additive matrix of the plurality of additive matrices 205 is of a number of columns that is the same as the number of columns of the first matrix 201 and the number of rows in each additive matrix 205 is smaller than the number of rows of the first matrix 201. In some embodiments, the processing circuitry evaluates each respective matrix instantiation 203 for a respective number of incident cycles of at most a predetermined length. In some embodiments, the processing circuitry calculates the number of incident cycles of a respective matrix instantiation 203 by generating a Tanner Graph that corresponds to the respective matrix and determines the number of incident cycles of at most the predetermined length in the generated Tanner graph. Once each matrix instantiation 203 has been evaluated for incident cycles of at most a predetermined length, processing circuitry selects a matrix instantiation from the plurality of matrix instantiation based on the corresponding number of incident cycles within each matrix instantiation 203. For example, processing circuitry selects a matrix instantiation that has the fewest number of incident cycles of at most the predetermined length among the plurality of matrix instantiations. The matrix instantiation with the fewest incident cycles of at most the predetermined length is selected to prioritize error code construction with matrices that are highly extensible. By selecting a matrix instantiation that constructs reliable error correction codes, this process reduces the likelihood of errors in the construction of error correction code, which reduces the overall error floor for error correction code construction in the configured transmitting device. The matrix instantiation selected by processing circuitry is referred to as the modified first matrix 207. The modified first matrix 207 is of the first size.

A matrix that contains many incident cycles may cause an unexpected increase in the rate of error correction code failures, even when transmitting on a bus or channel with little noise, and therefore raise the error floor of the constructed error correction codes. In order to reduce the error floor of bit errors during error correction code construction, incident cycles of at most a predetermined length should be avoided or removed from matrices by matrix manipulation. In some embodiments, the predetermined length corresponds to a length of incident cycles that cause a greater rate of error correction code failures than lengths that are longer than the predetermined length. The iterative error correction code construction of the present disclosure is dependent on the predetermined length, such that incident cycles of at most the predetermined length are to be evaluated, and reduced or avoided within each respective matrix of the combination set of matrices.

At step 206, processing circuitry performs an encoder gate optimization process using the modified first matrix 207 to generate a further modified first matrix 213, wherein fewer encoder gates are needed to encode data using the further modified first matrix 213 than when using the modified first matrix 207. In some embodiments, processing circuitry causes at least one swap between a first row 209 and a second row 211 for the modified first matrix 207 to generate the further modified first matrix 213. In some embodiments, processing circuitry causes a series of row swaps, each row swap performed with a respective first row (e.g. first row 209) and a respective second row (e.g., second row 211) among the number of rows of the modified first matrix 207. The processing circuitry may also cause at least one swap between a first column and a second column for the modified first matrix 207 to generate the further modified first matrix 213. In some embodiments, processing circuitry causes a series of column swaps, each column swap performed with a respective first column and a respective second column among the number of columns of the modified first matrix 207. The processing circuitry may cause one or more of each row swap and column swap to generate the further modified first matrix 213. In some embodiments, processing circuitry concurrently executes multiple series of row swaps and column swaps on a respective copy of the modified first matrix 207 to generate multiple swapped matrices. In some embodiments, each swapped matrix includes a respective data submatrix and a respective parity check submatrix. To generate the further modified first matrix, processing circuitry may generate a respective inverse matrix of the respective parity check submatrix for each of the multiple swapped matrices. In some embodiments, processing circuitry evaluates the inverse matrix of the respective parity check submatrix for each swapped matrix for a number of encoder gates needed to encode data using the respective swapped matrix. In some embodiments, processing circuitry evaluates each respective inverse matrix for a number of encoder gates needed to encode data using the corresponding swapped matrix based on a number of non-zero values in the respective inverse matrix. In some embodiments, processing circuitry selects one of the multiple swapped matrices with the fewest number of encoder gates needed to encode transmission data. The selected swapped matrix with the fewest number of encoder gates needed to encode transmission data may be referred to as the further modified first matrix 213.

At step 208, processing circuitry generates a second matrix 215 that includes the further modified first matrix 213 as a submatrix. In some embodiments, each of the further modified first matrix 213 and the second matrix 215 is part of a combination set of matrices 216. In some embodiments, the further modified first matrix 213 is of the first size, including a first number of rows, and the second matrix is of a second size, including a second number of rows that is greater than the first number of rows. In some embodiments, the second matrix 215 includes a plurality of new submatrices in locations of the second matrix that are not populated by the further modified first matrix.

At step 210, the processing circuitry performs the incident cycle optimization process using the second matrix 215 to generate a modified second matrix 219 that has fewer incident cycles than the second matrix 215. Processing circuitry generates the modified second matrix 219 with fewer incident cycles than the second matrix 215 with the same incident cycle optimization process used at step 204. In some embodiments, processing circuitry generates a plurality of matrix instantiations 217 based on the second matrix 215 and a plurality of additive matrixes 218, and evaluates each respective matrix instantiation 217 for a respective number of incident cycles. In such embodiments, processing circuitry selects a matrix instantiation with the fewest number of incident cycles, and the selected matrix instantiation is referred to as the modified second matrix 219.

At step 212, processing circuitry performs the encoder gate optimization process using each of the further modified first matrix 213 and the modified second matrix 219 to generate a further modified second matrix 223, wherein fewer encoder gates are needed to encode data using the further modified second matrix 223 than when using the modified second matrix 219. Processing circuitry performs the same encoder gate optimization process, as shown at step 206, on the further modified first matrix 213 and modified second matrix 219. In some embodiments, when processing circuitry causes row swaps between a respective first row 220 and second row 221 on the modified second matrix 219, the processing circuitry also performs the same row swaps on the further modified first matrix 213. In addition, when the processing circuitry causes column swaps between a respective first column and second column on the modified second matrix 219, the processing circuitry also causes the same column swaps on the further modified first matrix 213. In some embodiments, processing circuitry generates multiple swapped matrices based on the modified second matrix 219. When the processing circuitry selects a swapped matrix as the further modified second matrix 223 that needs the fewest number of encoder gates to encode data, the further modified first matrix that is a submatrix of the selected swapped matrix may be used as the further modified first matrix 222 within the combination set of matrices 216. Therefore, the encoder gate optimization process may modify each previously-generated and optimized matrix (e.g., matrix 1, matrix 2, . . . , matrix N−1) of the combination set of matrices (e.g., combination set 216) when performing the encoder gate optimization process on matrix N of the combination set of matrices.

At step 214, processing circuitry configures a transmitting device using the further modified first matrix 222 and the further modified second matrix 223. In some embodiments, processing circuitry of the matrix-generating device configures the transmitting device via a data bus interface (e.g., data bus interface 115) which communicatively couples the processing circuitry 104 to the I/O circuitry 113 of the transmitting device. Furthermore, the transmitting device is configured to receive transmission data via the I/O circuitry, encode the transmission data using one of the further modified first matrix and the further modified second matrix, and transmit the encoded transmission data over a channel. In some embodiments, each of the further modified first matrix 222 and further modified second matrix 223 is a part of a combination set of matrices 216. As previously discussed, the combination set of matrices 216 may include more than two optimized matrices (e.g., the further modified first matrix 222 and the further modified second matrix 223). In some embodiments, processing circuitry configures the transmitting device using each matrix of the combination set of matrices. Therefore, the transmitting device is configured to receive transmission data, encode the transmission data using one optimized matrix of the combination set of matrices 216, and transmit the encoded transmission data over the channel. In some embodiments, processing circuitry also configures the transmitting device to select one optimized matrix of the combination set of matrices 216 (e.g., the further modified first matrix 222 and further modified second matrix 223) based on at least one of the size of the transmission data and the size of available memory. For each respective transmitting device communicatively coupled to the matrix-generating device, processing circuitry configures the respective transmitting device to generate an error correction code engine based at least in part on a combination set of matrices 216. In some embodiments, the matrix-generating device may construct multiple combination sets of matrices 216, each respective combination set of matrices used to configure a respective transmitting device to generate a respective error correction code engine.

Figure 3:
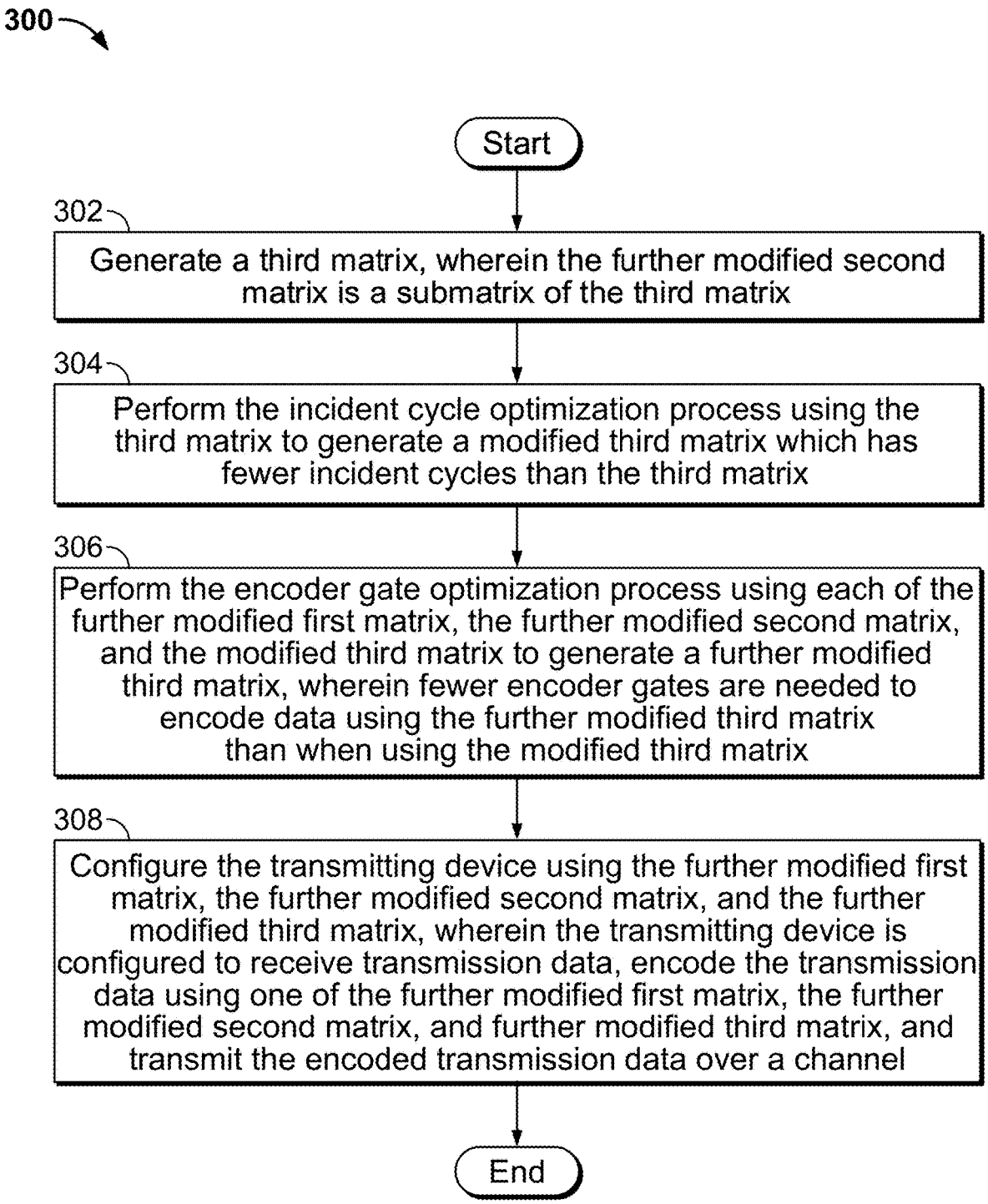

FIG. 3 shows a flowchart of illustrative steps of process 300 for constructing a set of error correction codes, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, memory 106 stores instructions that when executed by processing circuitry 104 cause steps 302-308 to be performed. In some embodiments, process 300 can be modified by, for example, having steps rearranged, changed, added, and/or removed. The illustrative steps of process 300 are, for example, an extension of FIG. 2 wherein process 300 would be performed in an embodiment of combination set of matrices with three generated and optimized matrices.

At step 302, processing circuitry (e.g., processing circuitry 104) generates a third matrix that includes the further modified second matrix as a submatrix. Therefore, the further modified first matrix is also a submatrix of the third matrix. In some embodiments, each of the further modified first matrix, the further modified second matrix, and the third matrix is part of a combination set of matrices. In some embodiments, the further modified second matrix is of the second size, including a second number of rows, and the third matrix is of a third size, including a third number of rows that is greater than the second number of rows. In some embodiments, the third matrix includes a plurality of new submatrices in locations of the third matrix that are not populated by the further modified second matrix.

At step 304, the processing circuitry performs the incident cycle optimization process using the third matrix to generate a modified third matrix that has fewer incident cycles than the third matrix. In some embodiments, processing circuitry generates a plurality of matrix instantiations based on the third matrix and evaluates each respective matrix instantiation for a respective number of incident cycles. In such embodiments, processing circuitry selects a matrix instantiation with the fewest number of incident cycles, and the selected matrix instantiation is referred to as the modified third matrix. In some embodiments, the processing circuitry generates and optimizes N number of matrices. In such embodiments, processing circuitry uses the same incident cycle optimization process on each respective matrix of the N number of matrices to reduce the rate of error correction code failures in the transmitting device configured by processing circuitry.

At step 306, processing circuitry performs the encoder gate optimization process using each of the further modified first matrix, the further modified second matrix, and the modified third matrix to generate a further modified third matrix, wherein fewer encoder gates are needed to encode data using the further modified third matrix than when using the modified third matrix. Processing circuitry performs the same encoder gate optimization process, as shown at steps 206 and 212 of FIG. 2, on the further modified first matrix, further modified second matrix, and modified third matrix. In some embodiments, when processing circuitry causes row swaps between a respective first row and second row on the modified third matrix, the processing circuitry also performs the same row swaps on each of the further modified first matrix and further modified second matrix. In addition, when processing circuitry causes columns swaps between a respective first column and second column on the modified third matrix, the processing circuitry also causes the same column swaps on each of the further modified first matrix and further modified second matrix. In some embodiments, the combination set of matrices includes the further modified first matrix, further modified second matrix and third matrix. In some embodiments, processing circuitry generates multiple swapped matrices based on the modified third matrix. The processing circuitry then selects a swapped matrix of the multiple swapped matrices as the further modified third matrix that needs the fewest number of encoder gates to encode data. In some embodiments, processing circuitry may use the further modified first matrix and further modified second matrix that are submatrices of the selected swapped matrix as the further modified first matrix and further modified second matrix within the combination set of matrices. Therefore, the encoder gate optimization process may modify each previously-generated and optimized matrix (e.g., matrix 1, matrix 2, . . . , matrix N−1) of the combination set of matrices when performing the encoder gate optimization process on matrix N of the combination set of matrices.

At step 308, processing circuitry configures the transmitting device using the further modified first matrix, the further modified second matrix, and the further modified third matrix. The transmitting device is configured to receive transmission data, encode the transmission data using one of the further modified first matrix, the further modified second matrix, and the further modified third matrix, and transmit the encoded transmission data over a channel. In some embodiments, each of the further modified first matrix, further modified second matrix, and further modified third matrix is a part of a combination set of matrices. In some embodiments, the combination set of matrices may include N number of optimized matrices. In some embodiments, processing circuitry configures the transmitting device using each matrix of the combination set of matrices. Therefore, the transmitting device is configured to receive transmission data, encode the transmission data using one optimized matrix of the combination set of matrices, and transmit the encoded transmission data over the channel. In some embodiments, processing circuitry also configures the transmitting device to select one optimized matrix of the combination set of matrices based on at least one of the size of the transmission data, the size of the channel, and the size of available memory. For each respective transmitting device communicatively coupled to the matrix-generating device, processing circuitry configures the respective transmitting device to generate an error correction code engine based at least in part on a combination set of matrices. In some embodiments, matrix-generating device may construct multiple combination sets of matrices, each respective combination set of matrices used to configure a respective transmitting device to generate a respective error correction code engine.

Figure 4:
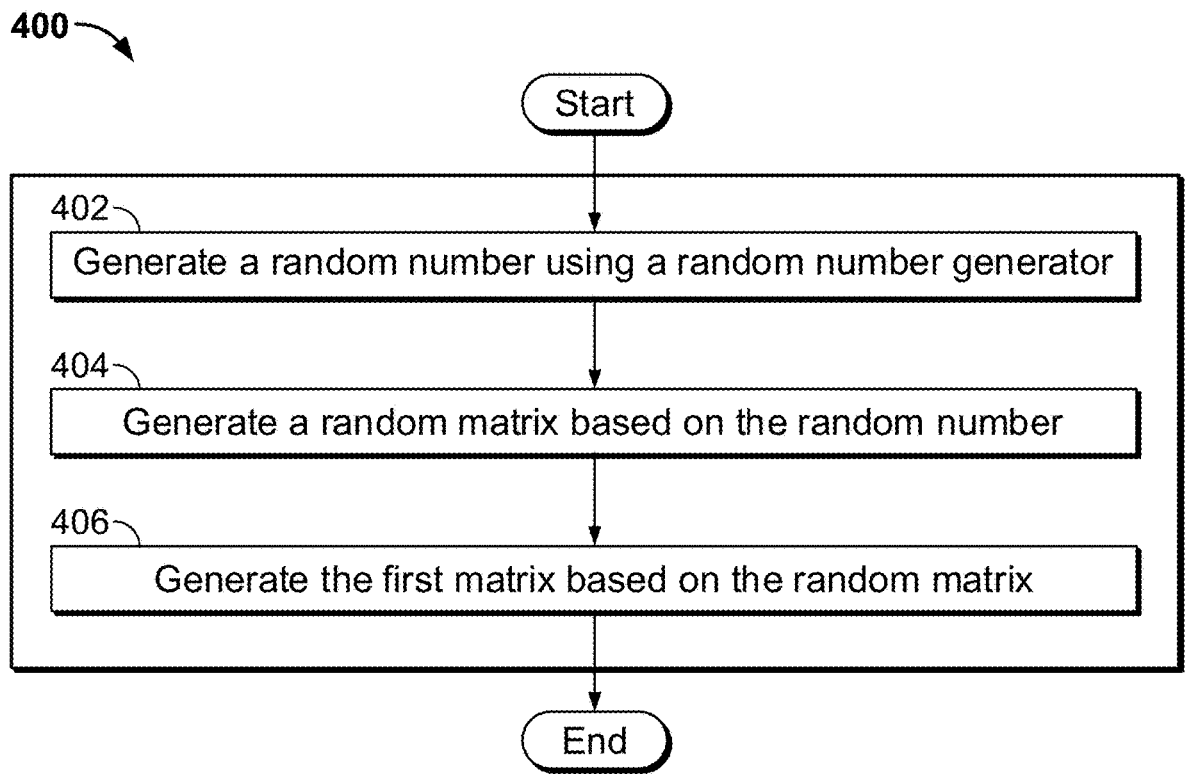
FIGS. 4 and 5 show flowcharts of illustrative steps of subprocesses for generating a first matrix and a second matrix, respectively, in accordance with some embodiments of the present disclosure.

FIG. 4 shows a flowchart of illustrative steps of subprocess 400 for generating a first matrix in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 400 can be modified by, for example, having steps rearranged, changed, added, and/or removed. In some embodiments, memory 106 stores instructions that when executed by processing circuitry 104 cause steps 402-406 to be performed. In some embodiments, subprocess 400 may correspond to step 202 shown in FIG. 2.

At step 402, processing circuitry (e.g., processing circuitry 104) generates a random number using a random number generator. In some embodiments, a random number generator is implemented within the processing circuitry. The random number generated may be stored in the memory of the matrix-generating device to be used to generate a random matrix, at step 404. In some embodiments, processing circuitry receives data from an external source, the data including a random number or data to be used to generate a random matrix, as shown at step 404.

At step 404, processing circuitry generates a random matrix based on the random number. In some embodiments, processing circuitry generates the random matrix by using a random matrix generator and the random number. In some embodiments, the random matrix is of a predetermined size.

At step 406, processing circuitry generates the first matrix based on the random matrix. In some embodiments, the random matrix is used as the first matrix. In some embodiments, processing circuitry may manipulate or change the random matrix to generate the first matrix. The first matrix generated by processing circuitry is of the predetermined size and includes a data submatrix and a parity check submatrix.

Figure 5:
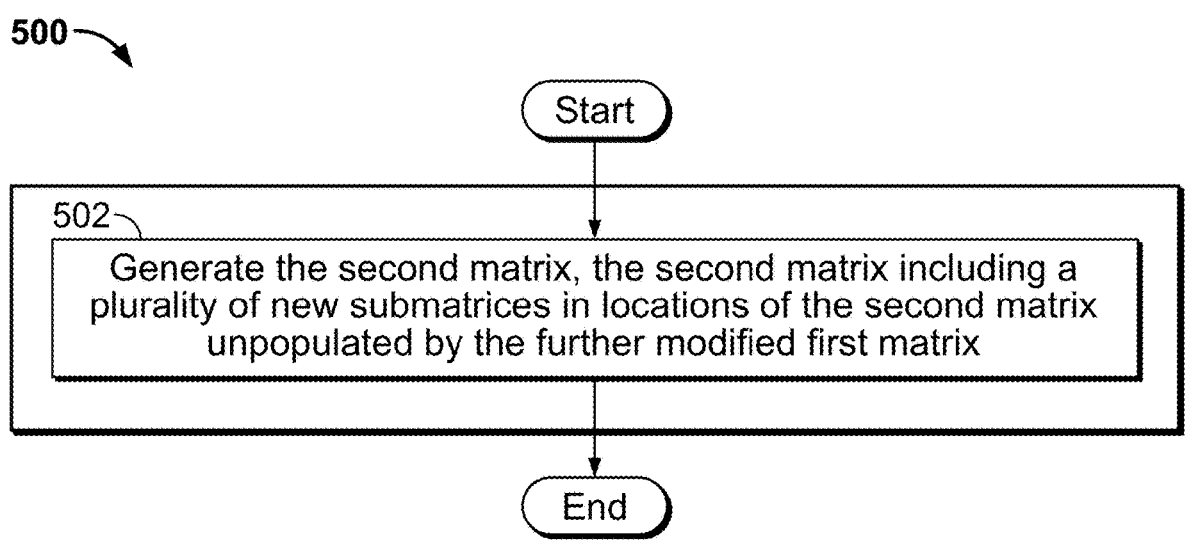

FIG. 5 shows a flowchart of illustrative steps of subprocess 500 for generating a second matrix, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 500 can be modified by, for example, having steps rearranged, changed, added, and/or removed. In some embodiments, memory 106 stores instructions that when executed by processing circuitry 104 causes step 502 to be performed. In some embodiments, subprocess 500 may correspond to step 208 shown in FIG. 2.

At step 502, processing circuitry (e.g., processing circuitry 104) generates the second matrix such that the second matrix includes a plurality of new submatrices in locations of the second matrix unpopulated by the further modified first matrix. In some embodiments, processing circuitry randomly generates the new plurality of submatrices in locations of the second matrix unpopulated by the further modified first matrix. The second matrix generated by processing circuitry is of a size greater than that of the further modified first matrix. In some embodiments, processing circuitry generates each subsequent matrix (e.g., a third matrix) of a combination set of matrices in a similar manner as shown in process 500. In such embodiments, processing circuitry generates the third matrix that includes the further modified second matrix as a submatrix. Therefore, the further modified first matrix is also a submatrix of the third matrix generated by processing circuitry. For any matrix entry locations of the third matrix unpopulated by the further modified second matrix, processing circuitry generates a plurality of new submatrices to generate the third matrix.

Figure 6:
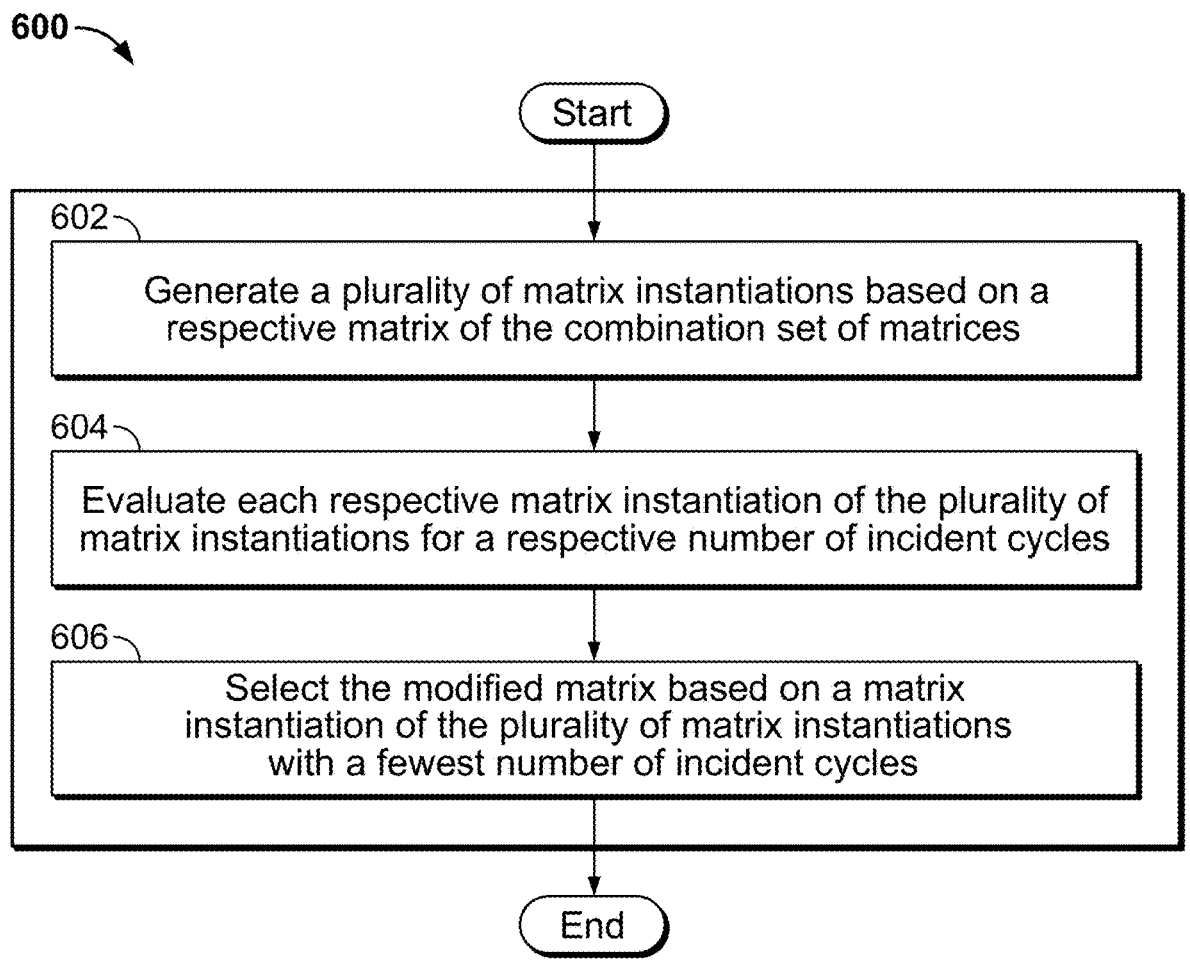
FIG. 6 shows a flowchart of illustrative steps of a subprocess for performing the incident cycle optimization process to generate a modified matrix based on a respective matrix of the combination set of matrices, in accordance with some embodiments of the present disclosure.

FIG. 6 shows a flowchart of illustrative steps of subprocess 600 for performing the incident cycle optimization process to generate a modified matrix based on a respective matrix of the combination set of matrices, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 600 can be modified by, for example, having respective steps rearranged, changed, added, and/or removed. In some embodiments, memory 106 stores instructions that when executed by processing circuitry 104 cause steps 602-606 to be performed. In some embodiments, subprocess 600 is used to perform each of step 204 and step 210, respectively, as shown in FIG. 2.

At step 602, processing circuitry (e.g., processing circuitry 104) generates a plurality of matrix instantiations based on a respective matrix of the combination set of matrices (e.g., first matrix and second matrix). In some embodiments, processing circuitry generates the plurality of matrix instantiations using a plurality of additive matrices. In some embodiments, each additive matrix of the plurality of additive matrices is of a number of rows that is the same as the number of rows of the respective matrix of the combination set of matrices. In some embodiments, the number of columns in each additive matrix is smaller than the number of columns of respective matrix. In some embodiments, each additive matrix of the plurality of additive matrices is of a number of columns that is the same as the number of columns of the respective matrix of the combination set of matrices and the number of rows in each additive matrix is smaller than the number of rows of the respective matrix of the combination set of matrices.

At step 604, processing circuitry evaluates each respective matrix instantiation of the plurality of matrix instantiations for a respective number of incident cycles. In some embodiments, the processing circuitry evaluates each respective matrix instantiation for a respective number of incident cycles of at most a predetermined length. In some embodiments, the predetermined length is determined based on an incident cycle length which corresponds with a certain error correction code construction failure rate. In some embodiments, the processing circuitry calculates the number of incident cycles of a respective matrix instantiation by generating a Tanner Graph that corresponds to the respective matrix instantiation and determines the number of incident cycles of at most the predetermined length in the generated Tanner graph. In some embodiments, the processing circuitry generates a Tanner graph that represents a respective matrix instantiation of the plurality of matrix instantiations. In some embodiments, a Tanner graph corresponding to a matrix instantiation includes nodes that are used to represent state constraints or equations for error correction codes. In some embodiments, the processing circuitry determines the number of incident cycles of at most the predetermined length in the Tanner graph that represents the matrix. An incident cycle may be defined as a sequence of nodes, each respective node of the sequence of nodes connected to a respective subsequent node by a respective edge, wherein the sequence of nodes may be traversed along the edges of the sequence of nodes from a first node of the sequence to a last node of the sequence without repeating any of the previously traversed edges. An incident cycle may be represented by a sequence of nodes connected by edges in the Tanner graph corresponding to the respective matrix. In some embodiments, processing circuitry evaluates the Tanner graph for incident cycles of at most a predetermined length by using a Fossorier Condition.

At step 606, processing circuitry selects the modified matrix based on a matrix instantiation of the plurality of matrix instantiations with the fewest number of incident cycles. Once each matrix instantiation has been evaluated for incident cycles of at most a predetermined length, processing circuitry selects a matrix instantiation from the plurality of matrix instantiation based on the corresponding number of incident cycles within each matrix instantiation. For example, processing circuitry selects a matrix instantiation that has the fewest number of incident cycles of at most the predetermined length among the plurality of matrix instantiations. The matrix instantiation with the fewest incident cycles of at most the predetermined length is selected to prioritize error code construction with matrices that are highly extensible. A matrix with many incident cycles of at most the predetermined length may cause error correction code failures at a greater rate than matrices with fewer or no incident cycles of at most the predetermined length. By selecting a matrix instantiation that constructs reliable error correction codes, this process 600 reduces the likelihood of errors in the construction of error correction code, which reduces the overall error floor for error correction code construction in the configured transmitting device. The matrix instantiation selected by processing circuitry is referred to as the modified matrix (e.g., the first modified matrix and second modified matrix) of the respective matrix of the combination set of matrices (e.g., the first matrix and the second matrix).

Figure 7:
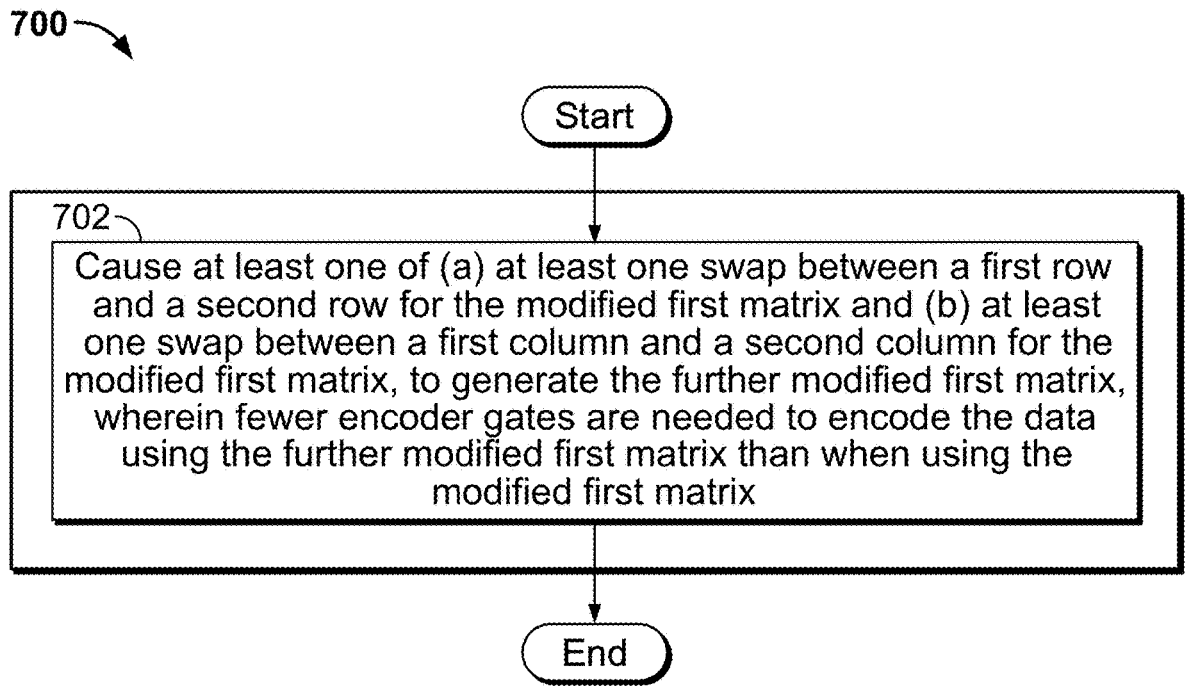
FIGS. 7 and 8 show flowcharts of illustrative steps of subprocesses for performing the encoder gate optimization process to generate a further modified first matrix and a further modified second matrix, respectively, in accordance with some embodiments of the present disclosure.

FIG. 7 shows a flowchart of illustrative steps of subprocess 700 for performing the encoder gate optimization process to generate a further modified first matrix in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 700 can be modified by, for example, having steps rearranged, changed, added, and/or removed. In some embodiments, memory 106 stores instructions that when executed by processing circuitry 104 causes step 702 to be performed. In some embodiments, subprocess 700 may correspond to step 206 shown in FIG. 2.

At step 702, processing circuitry (e.g., processing circuitry 104) causes at least one of (a) at least one swap between a first row and a second row for the modified first matrix and (b) at least one swap between a first column and a second column for the modified first matrix, to generate the further modified first matrix, wherein fewer encoder gates are needed to encode data using the further modified first matrix than when using the modified first matrix. In some embodiments, processing circuitry causes at least one swap between a first row and a second row for the modified first matrix to generate the further modified first matrix. In some embodiments, processing circuitry causes a series of row swaps, each row swap performed with a respective first row and a respective second row among the number of rows of the modified first matrix. The processing circuitry may also cause at least one swap between a first column and a second column for the modified first matrix when generating the further modified first matrix. In some embodiments, processing circuitry causes a series of column swaps, each column swap performed with a respective first column and a respective second column among the number of columns of the modified first matrix. In some embodiments, processing circuitry concurrently executes multiple series of row swaps and column swaps on a respective copy of the modified first matrix to generate multiple swapped matrices. In some embodiments, each swapped matrix includes a respective data submatrix and a respective parity check submatrix. Therefore, subprocess 700 of the encoder gate optimization process may be performed concurrently to determine the further modified first matrix.

Figure 8:
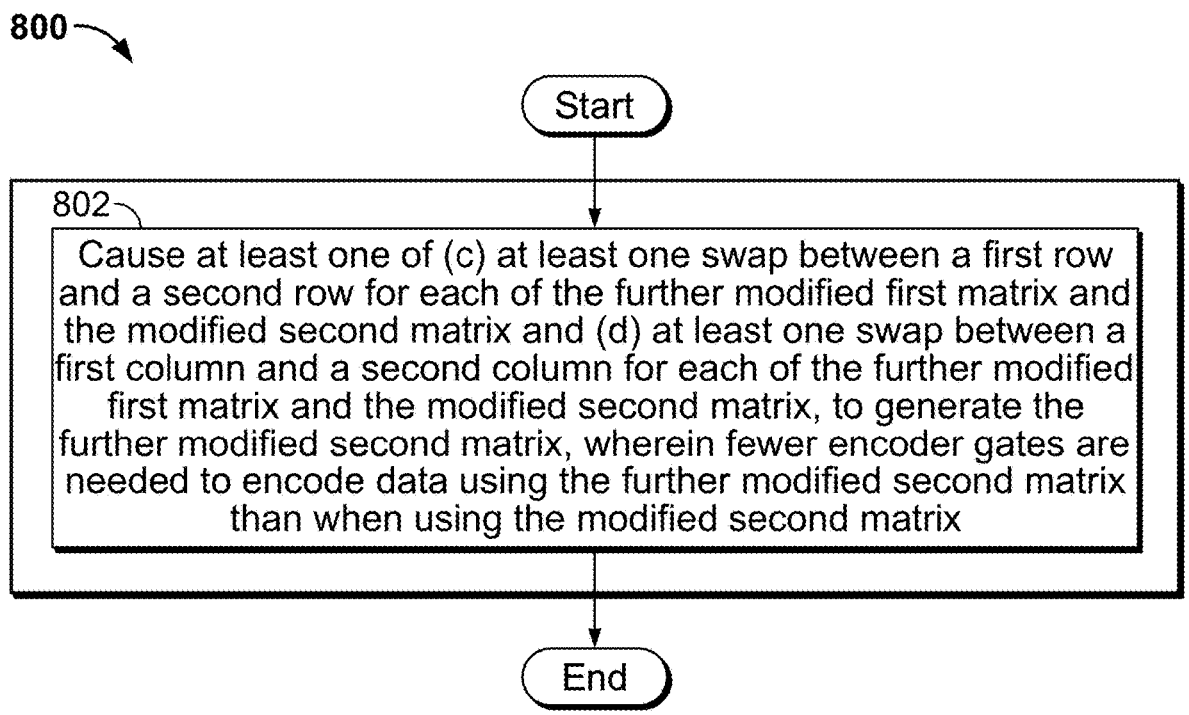

FIG. 8 shows a flowchart of illustrative steps of subprocess 800 for performing the encoder gate optimization process to generate a further modified second matrix in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 800 can be modified by, for example, having steps rearranged, changed, added, and/or removed. In some embodiments, memory 106 stores instructions that when executed by processing circuitry 104 causes step 802 to be performed. In some embodiments, subprocess 800 may correspond to step 212 shown in FIG. 2.

At step 802, processing circuitry (e.g., processing circuitry 104) causes at least one of (c) at least one swap between a first row and a second row for each of the further modified first matrix and the modified second matrix and (d) at least one swap between a first column and a second column for each of the further modified first matrix and the modified second matrix, to generate the further modified second matrix, wherein fewer encoder gates are needed to encode data using the further modified second matrix than when using the modified second matrix. In some embodiments, when processing circuitry causes row swaps between a respective first row and second row on the modified second matrix, the processing circuitry also performs the same row swaps on the further modified first matrix. Additionally, when processing circuitry causes column swaps between a respective first column and second column on the modified second matrix, the processing circuitry also performs the same column swaps on the further modified first matrix. In some embodiments, processing circuitry generates multiple swapped matrices based on the modified second matrix. When the processing circuitry selects a swapped matrix as the further modified second matrix that needs the fewest number of encoder gates to encode data, the further modified first matrix that is a submatrix of the selected swapped matrix may be used as the further modified first matrix within the combination set of matrices.

Therefore, subprocess 800 of the encoder gate optimization process may modify each previously-generated and optimized matrix (e.g., matrix 1, matrix 2, ..., matrix N–1) of the combination set of matrices when performing the encoder gate optimization process on matrix N of the combination set of matrices. In some embodiments, subprocess 800 may be performed concurrently to determine the further modified second matrix with fewer encoder gates needed to encode transmission data than the modified second matrix.

Figure 9:
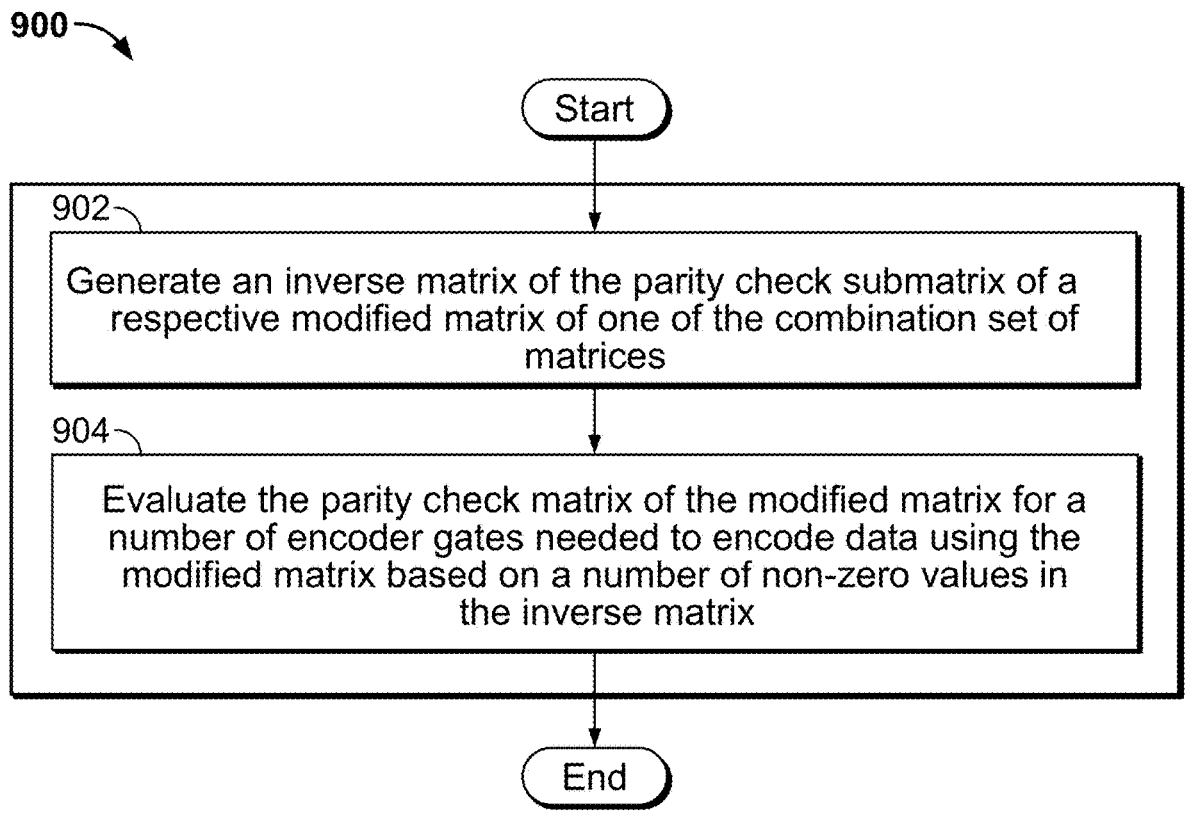
FIG. 9 shows a flowchart of illustrative steps of a subprocess for performing the encoder gate optimization process to generate a further modified matrix and based on a respective modified matrix, in accordance with some embodiments of the present disclosure.

FIG. 9 shows a flowchart of illustrative steps of subprocess 900 for performing the encoder gate optimization process to generate a further modified matrix (e.g., the further modified first matrix and the further modified second matrix) based on a respective modified matrix (e.g., the modified first matrix and the modified second matrix), in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110, respectively. In some embodiments, subprocess 900 can be modified by, for example, having respective steps rearranged, changed, added, and/or removed. In some embodiments, memory 106 stores instructions that when executed by processing circuitry 104 cause steps 902-904 to be performed. In some embodiments, subprocess 900 is used to perform step 206 and step 212, respectively, as shown in FIG. 2.

At step 902, processing circuitry (e.g., processing circuitry 104) generates an inverse matrix of the parity check submatrix of a respective modified matrix (e.g., the modified first matrix and the modified second matrix). In some embodiments, as shown in process 700 of FIG. 7, there may be multiple swapped matrices for processing circuitry to evaluate. In some embodiments, each swapped matrix includes a data submatrix and a parity check submatrix. Processing circuitry generates a respective inverse matrix of the respective parity check submatrix for each of the multiple swapped matrices and then evaluates the inverse matrix of the respective parity check submatrix for each swapped matrix for a number of encoder gates needed to encode data using the respective swapped matrix, at step 904.

At step 904, processing circuitry evaluates the parity check submatrix of the respective modified matrix for a number of encoder gates needed to encode data using the respective modified matrix based on a number of non-zero values in the inverse matrix. In some embodiments, processing circuitry evaluates each respective inverse matrix for a number of encoder gates needed to encode data using the corresponding swapped matrix based on a number of non-zero values in the respective inverse matrix. In some embodiments, processing circuitry selects one of the multiple swapped matrices with the fewest number of encoder gates needed to encode transmission data. The selected swapped matrix with the fewest number of encoder gates needed to encode transmission data may be referred to as the further modified matrix for the respective modified matrix.

In some embodiments, the processing circuitry may evaluate the number of gates needed to encode data using the respective modified matrix in any suitable method. For example, processing circuitry determines a generator matrix (e.g., the inverse matrix of the parity check submatrix) of the respective modified matrix and evaluate the size of the encoder needed to encode data using the respective modified matrix.

Figure 10:
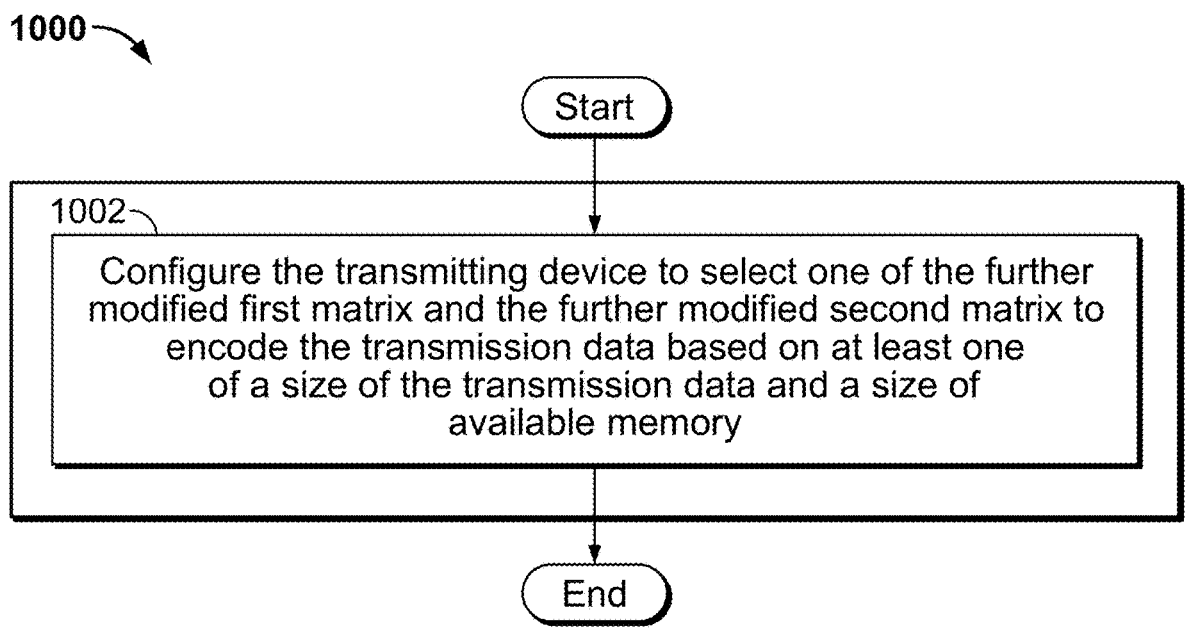
FIG. 10 shows a flowchart of illustrative steps of a subprocess for configuring the transmitting device using the further modified first matrix and the further modified second matrix, in accordance with some embodiments of the present disclosure.

FIG. 10 shows a flowchart of illustrative steps of a subprocess 1000 for configuring the transmitting device using the further modified first matrix and the further modified second matrix, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, subprocess 1000 can be modified by, for example, having steps rearranged, changed, added, and/or removed. In some embodiments, memory 106 stores instructions that when executed by processing circuitry 104 causes step 1002 to be performed. In some embodiments, subprocess 1000 may correspond to step 214 shown in FIG. 2.

At step 1002, processing circuitry (e.g., processing circuitry 104) configures the transmitting device to select one of the further modified first matrix and the further modified second matrix to encode the transmission data based on at least one of the size of the transmission data, the size of the channel, and the size of available memory. In some embodiments, the size of the transmission data determines which of the further modified first matrix and the further modified second matrix is selected to encode the transmission data. In some embodiments, when processing circuitry generates N number of optimized matrices using the incident cycle optimization process and encoder gate optimization process, each respective optimized matrix of a unique respective size, processing circuitry configures the transmitting device to select one of the N number of optimized matrices to encode the transmission data based on the size of the transmission data. In some embodiments, processing circuitry configures the transmitting device to select one of the further modified first matrix and the further modified second matrix to encode the transmission data based on the number of rows of the transmission data. For example, the transmitting device may determine whether any one of the further modified first matrix and the further modified second matrix has a respective number of rows that matches the number of rows of the transmission data and use the determined optimized matrix to encode the transmission data.

Figure 11:
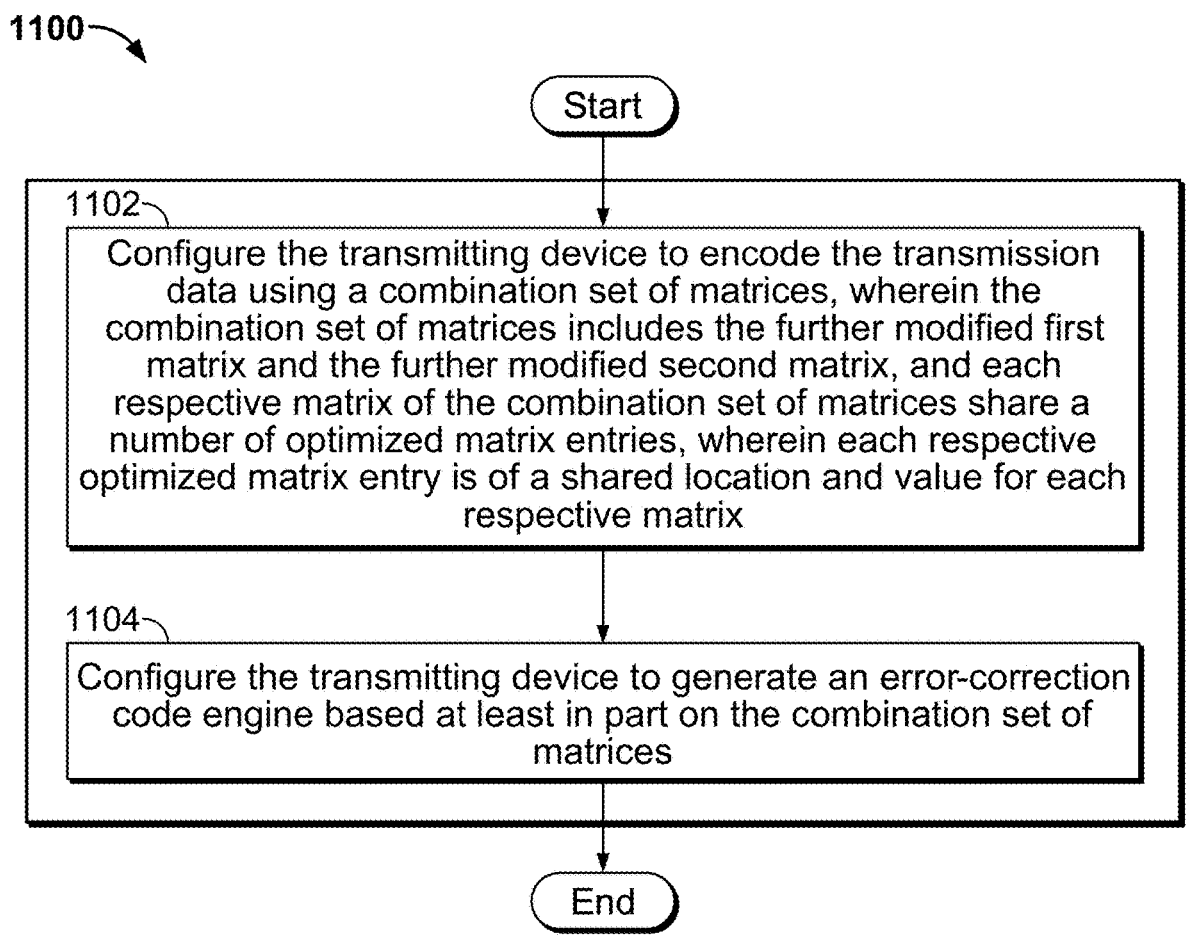
FIG. 11 shows a flowchart of illustrative steps of a subprocess for configuring the transmitting device using a combination set of matrices, in accordance with some embodiments of the present disclosure.

FIG. 11 shows a flowchart of illustrative steps of a subprocess 1100 for configuring the transmitting device using a combination set of matrices, in accordance with some embodiments of the present disclosure. In some embodiments, the referenced system, matrix-generating device, processing circuitry, memory, transmission data, transmitting device, and channel are implemented as system 100, matrix-generating device 102, processing circuitry 104, memory 106, transmission data 108, transmitting device 107, and channel 110 of FIG. 1, respectively. In some embodiments, subprocess 1100 can be modified by, for example, having steps rearranged, changed, added, and/or removed. In some embodiments, memory 106 stores instructions that when executed by processing circuitry 104 cause steps 1102-1104 to be performed. In some embodiments, subprocess 1100 may correspond to step 214 shown in FIG. 2.

At step 1102, processing circuitry (e.g., processing circuitry 104) configures the transmitting device to encode the transmission data using a combination set of matrices that includes the further modified first matrix and the further modified second matrix. In some embodiments, each respective matrix of the combination set of matrices shares a number of optimized matrix entries, wherein each respective optimized matrix entry is of a shared location and value for each respective matrix. In some embodiments, the combination set of matrices includes N number of matrices optimized using the incident cycle optimization process and the encoder gate optimization process, each respective matrix of the N number of matrices of a unique respective size. In some embodiments, processing circuitry performs the encoder gate optimization on each matrix of the combination set of matrices (e.g., further modified first matrix and the further modified second matrix). Once each respective matrix of the combination set of matrices has been optimized using the encoder gate optimization process each respective matrix shares a number of optimized matrix entries wherein each respective optimized entry is of a respective location within each respective matrix and is of a respective shared value for each respective matrix of the combination set.

At step 1104, processing circuitry configures the transmitting device to generate an error correction code engine based at least in part on the combination set of matrices. In some embodiments, the system may include more than one transmitting device and the processing circuitry of the matrix-generating device configures each transmitting device to generate a respective error correction code engine for each transmitting device based at least in part on the combination set of matrices. In some embodiments, processing circuitry generates and optimizes multiple combination sets of matrices and configures a respective transmitting device among multiple transmitting devices to generate a respective error correction code engine based at least in part on a respective combination set of matrices.

Figure 12:
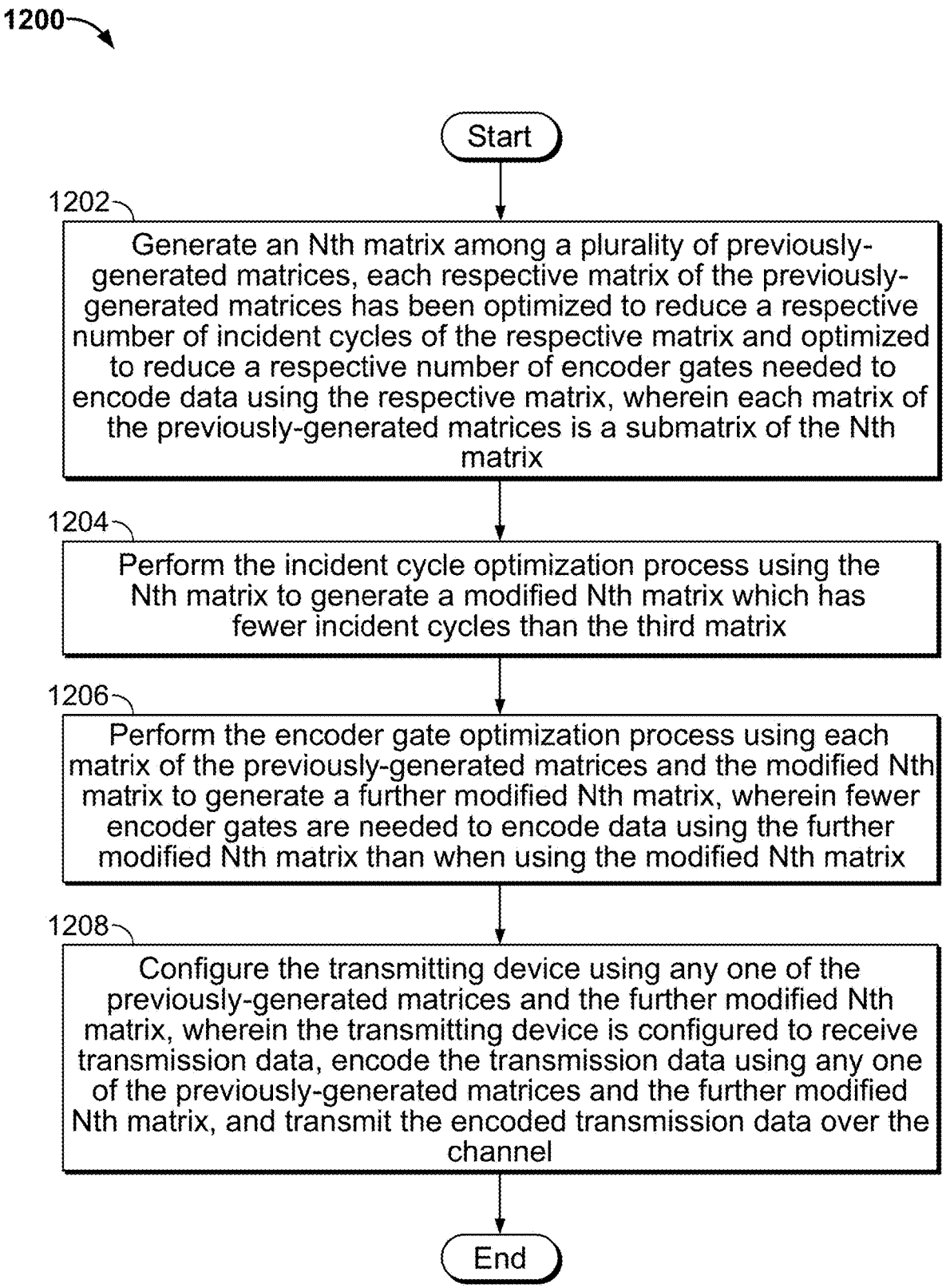
FIG. 12 shows a flowchart of illustrative steps for constructing a set of error correction codes using an iteratively-constructed combination set of matrices.

FIG. 12 shows a flowchart of illustrative steps of process 1200 for constructing a set of error correction codes using an iteratively-constructed combination set of matrices, in accordance with some embodiments of the present disclosure. In some embodiments, the referenced matrix-generating device, processing circuitry, memory, transmission data, transmitting device, and channel are implemented as matrix-generating device 102, processing circuitry 104, memory 106, transmission data 108, transmitting device 107, and channel 110 of FIG. 1, respectively. In some embodiments, memory 106 stores instructions that when executed by processing circuitry 104 cause steps 1202-1208 to be performed. In some embodiments, process 1200 can be modified by, for example, having steps rearranged, changed, added, and/or removed. The illustrative steps of process 1200 are, for example, an extension of FIG. 2 wherein process 1200 would be performed in an embodiment of combination set of matrices with N generated and optimized matrices.

At step 1202, processing circuitry (e.g., processing circuitry 104) generates an Nth matrix among a plurality of previously-generated matrices. In some embodiments, each matrix of the plurality of previously-generated matrices has been optimized to reduce a respective number of incident cycles of the respective matrix and optimized to reduce a respective number of encoder gates needed to encode data using the respective matrix. Additionally, each matrix of the previously-generated matrices is a submatrix of the Nth matrix. For example, when N=5, the previously-generated matrices include a further modified first matrix, further modified second matrix, further modified third matrix, and further modified fourth matrix. In such an example, each of the previously-generated matrices is a submatrix of the fifth matrix. In some embodiments, each of the previously-generated matrices and the fifth matrix is part of a combination set of matrices. In some embodiments, when processing circuitry generates N number of matrices, including generating the Nth matrix, the previously generated and optimized N−1 matrix (e.g., further modified N−1 matrix) is a submatrix of the Nth matrix. Therefore, a submatrix of the Nth matrix is populated by the N−1 matrix. In such embodiments, the Nth matrix includes a plurality of new submatrices in locations of the Nth matrix wherein the N−1 matrix has not populated.

At step 1204, the processing circuitry performs the incident cycle optimization process using the Nth matrix to generate a modified Nth matrix that has fewer incident cycles than the Nth matrix. In some embodiments, processing circuitry generates a plurality of matrix instantiations based on the Nth matrix and evaluates each respective matrix instantiation for a respective number of incident cycles. In such embodiments, processing circuitry selects a matrix instantiation with the fewest number of incident cycles, and the selected matrix instantiation is referred to as the modified Nth matrix.

At step 1206, processing circuitry performs the encoder gate optimization process using each matrix of the previously-generated matrices and the modified Nth matrix to generate a further modified Nth matrix, wherein fewer encoder gates are needed to encode data using the further modified Nth matrix than when using the modified Nth matrix. Processing circuitry performs the same encoder gate optimization process, as shown at steps 206 and 212 of FIG.

2 and 306 of FIG. 3, on each matrix of the previously-generated matrices and modified Nth matrix. In some embodiments, when processing circuitry causes row swaps between a respective first row and second row on the modified Nth matrix, the processing circuitry also performs the same row swaps on each matrix of the previously-generated matrices. In addition, when processing circuitry causes column swaps between a respective first column and second column on the modified Nth matrix, the processing circuitry also performs the same column swaps on each matrix of the previously-generated matrices. In some embodiments, processing circuitry generates multiple swapped matrices based on the modified Nth matrix. The processing circuitry then selects a swapped matrix of the multiple swapped matrices as the further modified Nth matrix that needs the fewest number of encoder gates to encode data.

At step 1208, processing circuitry configures the transmitting device using any one of the previously-generated matrices and the further modified Nth matrix. The transmitting device is configured to receive transmission data, encode the transmission data using any one of the previously-generated matrices and the further modified Nth matrix, and transmit the encoded transmission data over a channel. In some embodiments, the previously-generated matrices and the further modified Nth matrix are a part of a combination set of matrices. In some embodiments, processing circuitry also configures the transmitting device to select one optimized matrix of the combination set of matrices based on at least one of the size of the transmission data, channel size, and the size of available memory. For each respective transmitting device communicatively coupled to the matrix-generating device, processing circuitry configures the respective transmitting device to generate an error correction code engine based at least in part on a combination set of matrices. In some embodiments, matrix-generating device may construct multiple combination sets of matrices, each respective combination set of matrices used to configure a respective transmitting device to generate a respective error correction code engine.

Figure 13:
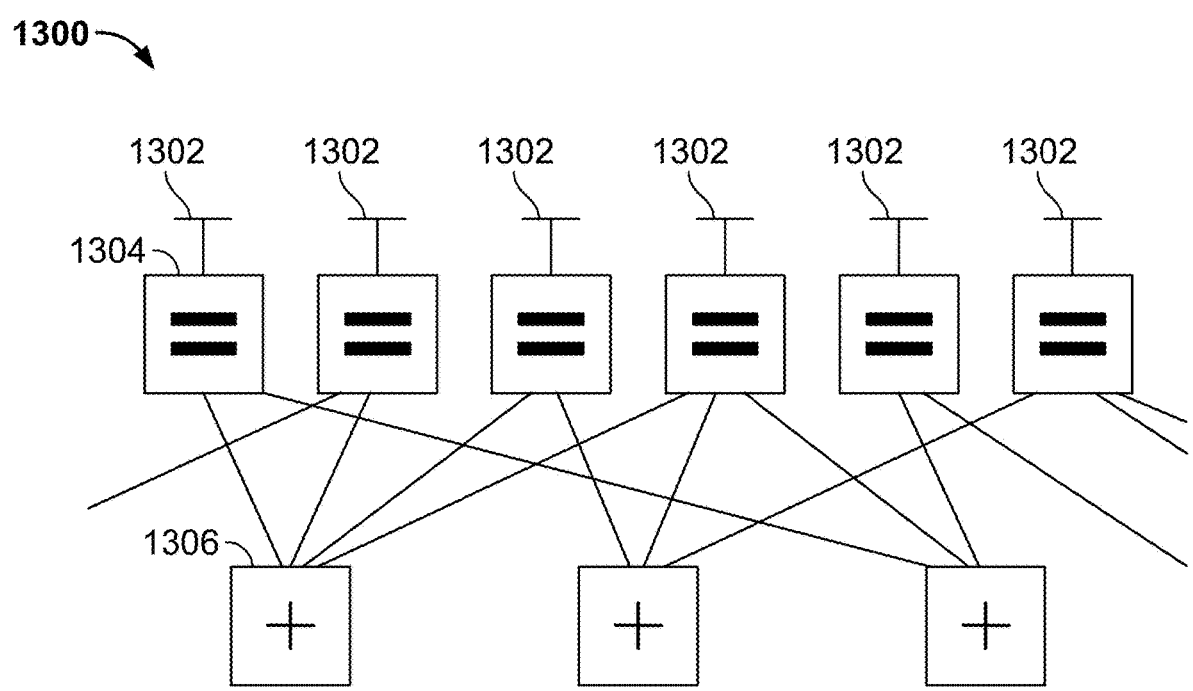
FIG. 13 shows a graphical illustration of a Forney's factor graph for low-density parity check (LDPC) codes.

FIG. 13 shows a graphical illustration of a Forney's factor graph 1300 for a respective parity check matrix for low-density parity check (LDPC) codes. This graph 1300 corresponds to linear code, specifically to an LDPC code with 3 rows and 6 columns. In some embodiments, a respective matrix is generated and optimized by the matrix-generating device 102, such that the respective matrix includes a parity check submatrix. In some embodiments, the encoding matrix is generated by the error correction code engine on transmitting device 107 (as shown in in FIG. 1) using the parity check submatrix of the respective matrix, the transmitting device configured based on the generated and optimized matrices of the combination set of matrices. Once the encoding matrix is generated, processing circuitry 112 of transmitting device 107 is configured to encode the transmission data using the encoding matrix. In some embodiments, transmitting device 107 multiplies the transmission data by the encoding matrix to determine the encoded transmission data. The graph 1300 includes N variable nodes 1304 which corresponds to a number of columns of a generated LDPC code, wherein the parity check submatrix of the generated LDPC code includes K number of rows. The graph 1300 also includes an N–K number of factor nodes 1306. In some embodiments, the bits of a valid signal 1302, must satisfy the graphical constraints defined by the parity check submatrix of the LDPC code. For example, the lines connecting to a respective variable node 1304 must have the same value (e.g., 0 or 1) and all values connecting to a respective factor node 1306 must sum, modulo two, to zero. In some embodiments, when these constraints are not met, the signal is invalid and may not be protected by the generated LDPC code.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments. Further, although process steps, method steps, algorithms or the like may be described in a sequential order, such processes, methods, and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article, or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified, or removed. Moreover, steps may be added to the above-described logic and still conform to the described embodiments. Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of Random Access Memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the electronic devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

What is claimed is:

1. A method for iteratively constructing a set of error correction codes, the method comprising:
   generating, by processing circuitry, a first matrix;
   performing, by the processing circuitry, an incident cycle optimization process using the first matrix to generate a modified first matrix which has fewer incident cycles than the first matrix;
   performing, by the processing circuitry, an encoder gate optimization process using the modified first matrix to generate a further modified first matrix, wherein fewer encoder gates are needed to encode data using the further modified first matrix than when using the modified first matrix;
   generating, by the processing circuitry, a second matrix, wherein the further modified first matrix is a submatrix of the second matrix;
   performing, by the processing circuitry, the incident cycle optimization process using the second matrix to generate a modified second matrix which has fewer incident cycles than the second matrix;
   performing, by the processing circuitry, the encoder gate optimization process using each of the further modified first matrix and the modified second matrix to generate a further modified second matrix, wherein fewer encoder gates are needed to encode data using the further modified second matrix than when using the modified second matrix; and
   configuring a transmitting device using the further modified first matrix and the further modified second matrix, wherein the transmitting device is configured to:
   receive transmission data;
   encode the transmission data using one of the further modified first matrix and the further modified second matrix; and
   transmit the encoded transmission data over a channel.

2. The method of claim 1, wherein generating the second matrix comprises generating a plurality of new sub-matrices in locations of the second matrix unpopulated by the further modified first matrix.

3. The method of claim 1, wherein configuring the transmitting device to encode the transmission data using one of the further modified first matrix and the further modified second matrix comprises configuring the transmitting device to encode the transmission data using a combination set of matrices, wherein:
   the combination set of matrices comprises the further modified first matrix and the further modified second matrix, and
   each respective matrix of the combination set of matrices shares a number of optimized matrix entries, wherein each respective optimized matrix entry is of a shared location and value for each respective matrix.

4. The method of claim 3, wherein configuring the transmitting device comprises configuring the transmitting device to:
   generate an error correction code engine based at least in part on the combination set of matrices.

5. The method of claim 1, wherein configuring the transmitting device comprises configuring the transmitting device to:
   select one of the further modified first matrix and the further modified second matrix to encode the transmission data based on at least one of a size of the transmission data, a size of the channel, and a size of available memory.

6. The method of claim 1, wherein generating a first matrix comprises:
   generating a random number using a random number generator;
   generating a random matrix based on the random number; and
   generating the first matrix based on the random matrix.

7. The method of claim 1, further comprising:
   generating a third matrix, wherein the further modified second matrix is a submatrix of the third matrix;
   performing the incident cycle optimization process using the third matrix to generate a modified third matrix which has fewer incident cycles than the third matrix;
   performing the encoder gate optimization process using each of the further modified first matrix, the further modified second matrix, and the modified third matrix to generate a further modified third matrix, wherein fewer encoder gates are needed to encode data using the further modified third matrix than when using the modified third matrix; and configuring the transmitting device using the further modified first matrix, the further modified second matrix and the further modified third matrix, wherein the transmitting device is configured to:

receive transmission data;

encode the transmission data using one of the further modified first matrix, the further modified second matrix, and the further modified third matrix; and transmit the encoded transmission data over the channel.

8. The method of claim 1, further comprising:

generating an Nth matrix among a plurality of previously-generated matrices, each respective matrix of the previously-generated matrices has been optimized to reduce a respective number of incident cycles of the respective matrix and optimized to reduce a respective number of encoder gates needed to encode data using the respective matrix, wherein each matrix of the previously-generated matrices is a submatrix of the Nth matrix;

performing the incident cycle optimization process using the Nth matrix to generate a modified Nth matrix which has fewer incident cycles than the Nth matrix;

performing the encoder gate optimization process using each matrix of the previously-generated matrices and the modified Nth matrix to generate a further modified Nth matrix, wherein fewer encoder gates are needed to encode data using the further modified Nth matrix than when using the modified Nth matrix; and configuring the transmitting device using any one of the previously-generated matrices and the further modified Nth matrix, wherein the transmitting device is configured to:

receive transmission data;

encode the transmission data using any one of: the previously-generated matrices and the further modified Nth matrix; and transmit the encoded transmission data over the channel.

9. The method of claim 1, wherein:

performing the incident cycle optimization process using the first matrix to generate a modified first matrix comprises:

generating a plurality of matrix instantiations based on the first matrix;

evaluating each respective matrix of the plurality of matrix instantiations for a respective number of incident cycles; and selecting the modified first matrix based on a matrix of the plurality of matrix instantiations with a fewest number of incident cycles; and performing the incident cycle optimization process using the second matrix to generate a modified second matrix comprises:

generating a plurality of matrix instantiations based on the second matrix;

evaluating each respective matrix of the plurality of matrix instantiations for a respective number of incident cycles; and selecting the modified second matrix based on a matrix of the plurality of matrix instantiations with a fewest number of incident cycles.

10. The method of claim 1, wherein:

performing the encoder gate optimization process using the modified first matrix to generate a further modified first matrix comprises:

causing at least one of (a) at least one swap between a first row and a second row for the modified first matrix and (b) at least one swap between a first column and a second column for the modified first matrix, to generate the further modified first matrix, wherein fewer encoder gates are needed to encode data using the further modified first matrix than when using the modified first matrix; and performing the encoder gate optimization process using each of the further modified first matrix and the modified second matrix to generate a further modified second matrix comprises:

causing at least one of (c) at least one swap between a first row and a second row for each of the further modified first matrix and the modified second matrix and (d) at least one swap between a first column and a second column for each of the further modified first matrix and the modified second matrix, to generate the further modified second matrix, wherein fewer encoder gates are needed to encode data using the further modified second matrix than when using the modified second matrix.

11. The method of claim 1, wherein performing the encoder gate optimization process using each of the further modified first matrix and the modified second matrix comprises performing the encoder gate optimization process using each of the further modified first matrix and the modified second matrix, wherein the encoder gate optimization process optimizes at least one of the further modified first matrix and the modified second matrix to generate a further modified second matrix.

12. The method of claim 1, wherein each of the first matrix, modified first matrix, further modified first matrix, second matrix, modified second matrix and further modified second matrix comprises:

a data submatrix; and a parity check submatrix.

13. The method of claim 12, wherein:

performing the encoder gate optimization process using the modified first matrix to generate a further modified first matrix comprises:

generating an inverse matrix of the parity check submatrix of the modified first matrix, and evaluating the parity check submatrix of the modified first matrix for a number of encoder gates needed to encode data using the modified first matrix based on a number of non-zero values in the inverse matrix; and performing the encoder gate optimization process using each of the further modified first matrix and the modified second matrix comprises:

generating an inverse matrix of the parity check submatrix of the modified second matrix, and evaluating the parity check submatrix of the modified second matrix for a number of encoder gates needed to encode data using the modified second matrix based on a number of non-zero values in the inverse matrix.

14. The method of claim 12, wherein for each of the first matrix, modified first matrix, further modified first matrix, second matrix, modified second matrix and further modified second matrix:

the data submatrix comprises a number of rows and a number of data columns, and the parity check submatrix comprises the number of rows and a number of parity check columns.

15. The method of claim 12, wherein each respective data submatrix of the first matrix, modified first matrix, further modified first matrix, second matrix, modified second matrix and further modified second matrix comprises a same number of data columns.

16. A system comprising:
a matrix-generating device comprising:
processing circuitry, to:
generate a first matrix;
perform an incident cycle optimization process using the first matrix to generate a modified first matrix which has fewer incident cycles than the first matrix;
perform an encoder gate optimization process using the modified first matrix to generate a further modified first matrix, wherein fewer encoder gates are needed to encode data using the further modified first matrix than when using the modified first matrix;
generate a second matrix, wherein the further modified first matrix is a submatrix of the second matrix;
perform the incident cycle optimization process using the second matrix to generate a modified second matrix which has fewer incident cycles than the second matrix;
perform the encoder gate optimization process using each of the further modified first matrix and the modified second matrix to generate a further modified second matrix, wherein fewer encoder gates are needed to encode data using the further modified second matrix than when using the modified second matrix; and
configure a transmitting device, which is communicatively coupled to the system, using the further modified first matrix and the further modified second matrix, wherein the transmitting device is configured to:
receive transmission data;
encode the transmission data using one of the further modified first matrix and the further modified second matrix; and
transmit the encoded transmission data over a channel.

17. The system of claim 16, wherein to generate the second matrix the processing circuitry is to generate a plurality of new sub-matrices in locations of the second matrix unpopulated by the further modified first matrix.

18. The system of claim 16, wherein to configure the transmitting device to encode the transmission data using one of the further modified first matrix and the further modified second matrix the processing circuitry is to configure the transmitting device to encode the transmission data using a combination set of matrices, wherein:
the combination set of matrices comprises the further modified first matrix and the further modified second matrix, and
each respective matrix of the combination set of matrices shares a number of optimized matrix entries, wherein each respective optimized matrix entry is of a shared location and value for each respective matrix.

19. The system of claim 18, wherein to configuring the transmitting device the processing circuitry is to configure the transmitting device to:

generate an error correction code engine based at least in part on the combination set of matrices.

20. The system of claim 16, wherein to configure the transmitting device the processing circuitry is to configure the transmitting device to:
select one of the further modified first matrix and the further modified second matrix to encode the transmission data based on at least one of a size of the transmission data, a size of the channel, and a size of available memory.

21. The system of claim 16, wherein to generate the first matrix the processing circuitry is to:
generate a random number using a random number generator;
generate a random matrix based on the random number; and
generate the first matrix based on the random matrix.

22. The system of claim 16, wherein the processing circuitry is further to:
generate a third matrix, wherein the further modified second matrix is a submatrix of the third matrix;
perform the incident cycle optimization process using the third matrix to generate a modified third matrix which has fewer incident cycles than the third matrix;
performing the encoder gate optimization process using each of the further modified first matrix, the further modified second matrix, and the modified third matrix to generate a further modified third matrix, wherein fewer encoder gates are needed to encode data using the further modified third matrix than when using the modified third matrix; and
configure the transmitting device, which is communicatively coupled to the system, using the further modified first matrix, the further modified second matrix, and the further modified third matrix, wherein the transmitting device is configured to:
receive transmission data;
encode the transmission data using one of the further modified first matrix, the further modified second matrix, and the further modified third matrix; and
transmit the encoded transmission data over the channel.

23. The system of claim 16, wherein the processing circuitry is further to:
generate an Nth matrix among a plurality of previously-generated matrices, each respective matrix of the previously-generated matrices has been optimized to reduce a respective number of incident cycles of the respective matrix and optimized to reduce a respective number of encoder gates needed to encode data using the respective matrix, wherein each matrix of the previously-generated matrices is a submatrix of the Nth matrix;
performing the incident cycle optimization process using the Nth matrix to generate a modified Nth matrix which has fewer incident cycles than the Nth matrix;
perform the encoder gate optimization process using each matrix of the previously-generated matrices and the modified Nth matrix to generate a further modified Nth matrix, wherein fewer encoder gates are needed to encode data using the further modified Nth matrix than when using the modified Nth matrix; and
configure the transmitting device using any one of the previously-generated matrices and the further modified Nth matrix, wherein the transmitting device is configured to:
receive transmission data;
encode the transmission data using any one of: the previously-generated matrices and the further modified Nth matrix; and
transmit the encoded transmission data over the channel.

24. The system of claim 16, wherein:
to perform the incident cycle optimization process using the first matrix to generate a modified first matrix the processing circuitry is to:
generate a plurality of matrix instantiations based on the first matrix;
evaluate each respective matrix of the plurality of matrix instantiations for a respective number of incident cycles; and
select the modified first matrix based on a matrix of the plurality of matrix instantiations with a fewest number of incident cycles; and
to perform the incident cycle optimization process using the second matrix to generate a modified second matrix the processing circuitry is to:
generate a plurality of matrix instantiations based on the second matrix;
evaluate each respective matrix of the plurality of matrix instantiations for a respective number of incident cycles; and
select the modified second matrix based on a matrix of the plurality of matrix instantiations with a fewest number of incident cycles.

25. The system of claim 16, wherein:
to perform the encoder gate optimization process using the modified first matrix to generate a further modified first matrix the processing circuitry is to:
cause at least one of (a) at least one swap between a first row and a second row for the modified first matrix and (b) at least one swap between a first column and a second column for the modified first matrix, to generate the further modified first matrix, wherein fewer encoder gates are needed to encode data using the further modified first matrix than when using the modified first matrix; and
to perform the encoder gate optimization process using each of the further modified first matrix and the modified second matrix to generate a further modified second matrix the processing circuitry is to:
cause at least one of (c) at least one swap between a first row and a second row for each of the further modified first matrix and the modified second matrix and (d) at least one swap between a first column and a second column for each of the further modified first matrix and the modified second matrix, to generate the further modified second matrix, wherein fewer encoder gates are needed to encode data using the further modified second matrix than when using the modified second matrix.

26. The system of claim 16, wherein to perform the encoder gate optimization process using each of the further modified first matrix and the modified second matrix the processing circuitry is to perform the encoder gate optimization process using each of the further modified first matrix and the modified second matrix, wherein the encoder gate optimization process optimizes at least one of the further modified first matrix and the modified second matrix to generate a further modified second matrix.

27. The system of claim 16, wherein each of the first matrix, modified first matrix, further modified first matrix, second matrix, modified second matrix and further modified second matrix comprises:
a data submatrix; and
a parity check submatrix.

28. The system of claim 27, wherein:
to perform the encoder gate optimization process using the modified first matrix to generate a further modified first matrix the processing circuitry is to:
generate an inverse matrix of the parity check submatrix of the modified first matrix, and
evaluate the parity check submatrix of the modified first matrix for a number of encoder gates needed to encode data using the modified first matrix based on a number of non-zero values in the inverse matrix; and
to perform the encoder gate optimization process using each of the further modified first matrix and the modified second matrix the processing circuitry is to:
generate an inverse matrix of the parity check submatrix of the modified second matrix, and
evaluate the parity check submatrix of the modified second matrix for a number of encoder gates needed to encode data using the modified second matrix based on a number of non-zero values in the inverse matrix.

29. The system of claim 27, wherein for each of the first matrix, modified first matrix, further modified first matrix, second matrix, modified second matrix and further modified second matrix:
the data submatrix comprises a number of rows and a number of data columns, and
the parity check submatrix comprises the number of rows and a number of parity check columns.

30. The system of claim 27, wherein each respective data submatrix of the first matrix, modified first matrix, further modified first matrix, second matrix, modified second matrix and further modified second matrix comprises a same number of data columns.

31. A non-transitory computer-readable medium having non-transitory computer-readable instructions encoded thereon that, when executed by processing circuitry, cause the processing circuitry to:
generate a first matrix;
perform an incident cycle optimization process using the first matrix to generate a modified first matrix which has fewer incident cycles than the first matrix;
perform an encoder gate optimization process using the modified first matrix to generate a further modified first matrix, wherein fewer encoder gates are needed to encode data using the further modified first matrix than when using the modified first matrix;
generate a second matrix, wherein the further modified first matrix is a submatrix of the second matrix;
perform the incident cycle optimization process using the second matrix to generate a modified second matrix which has fewer incident cycles than the second matrix;
perform the encoder gate optimization process using each of the further modified first matrix and the modified second matrix to generate a further modified second matrix, wherein fewer encoder gates are needed to encode data using the further modified second matrix than when using the modified second matrix; and
configure a transmitting device using the further modified first matrix and the further modified second matrix, wherein the transmitting device is configured to:

receive transmission data;
encode the transmission data using one of the further modified first matrix and the further modified second matrix; and
transmit the encoded transmission data over a channel.

32. A method for data transmission, the method comprising:
receiving transmission data;
encoding the transmission data using one of a further modified first matrix and a further modified second matrix, wherein the further modified first matrix and the further modified second matrix are generated by:
generating, by processing circuitry, a first matrix;
performing, by the processing circuitry, an incident cycle optimization process using the first matrix to generate a modified first matrix which has fewer incident cycles than the first matrix;
performing, by the processing circuitry, an encoder gate optimization process using the modified first matrix to generate the further modified first matrix, wherein fewer encoder gates are needed to encode data using the further modified first matrix than when using the modified first matrix;
generating, by the processing circuitry, a second matrix, wherein the further modified first matrix is a submatrix of the second matrix;
performing, by the processing circuitry, the incident cycle optimization process using the second matrix to generate a modified second matrix which has fewer incident cycles than the second matrix; and
performing, by the processing circuitry, the encoder gate optimization process using each of the further modified first matrix and the modified second matrix to generate the further modified second matrix, wherein fewer encoder gates are needed to encode data using the further modified second matrix than when using the modified second matrix; and
transmitting the encoded transmission data over a channel.

* * * * *